(12) United States Patent
Choi et al.

(10) Patent No.: US 12,150,340 B2
(45) Date of Patent: Nov. 19, 2024

(54) DISPLAY PANEL AND DISPLAY DEVICE INCLUDING THE SAME

(71) Applicant: LG Display Co., Ltd., Seoul (KR)

(72) Inventors: Jung Hun Choi, Paju-si (KR); Sung Jin Park, Paju-si (KR); Juhn Suk Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 428 days.

(21) Appl. No.: 17/358,791

(22) Filed: Jun. 25, 2021

(65) Prior Publication Data

US 2021/0408151 A1   Dec. 30, 2021

(30) Foreign Application Priority Data

Jun. 30, 2020 (KR) .................. 10-2020-0080190

(51) Int. Cl.
*H10K 59/121* (2023.01)
*H10K 50/80* (2023.01)
*H10K 59/122* (2023.01)
*H10K 59/65* (2023.01)

(52) U.S. Cl.
CPC ......... *H10K 59/121* (2023.02); *H10K 50/868* (2023.02); *H10K 59/122* (2023.02); *H10K 59/65* (2023.02)

(58) Field of Classification Search
CPC .... H10K 50/86; H10K 50/868; H10K 59/122; H10K 59/121; H10K 59/65; G09G 3/3233

See application file for complete search history.

(56) References Cited

U.S. PATENT DOCUMENTS

| | | | |
|---|---|---|---|
| 10,359,553 B2 | 7/2019 | Lee et al. | |
| 11,239,290 B2* | 2/2022 | Jang | H10K 59/121 |
| 2015/0054719 A1* | 2/2015 | Lee | G09G 3/3208 |
| | | | 345/76 |
| 2017/0221976 A1* | 8/2017 | Park | H10K 50/844 |
| 2020/0335730 A1* | 10/2020 | Oh | H10K 71/00 |
| 2020/0373372 A1* | 11/2020 | Chung | H10K 59/131 |
| 2021/0005687 A1* | 1/2021 | Jeon | H10K 59/122 |
| 2021/0020704 A1* | 1/2021 | Kim | H10K 59/353 |
| 2021/0028248 A1* | 1/2021 | Kim | H10K 71/00 |
| 2021/0141304 A1* | 5/2021 | Liu | C23C 14/0042 |
| 2021/0265430 A1* | 8/2021 | Chang | H10K 59/65 |

(Continued)

FOREIGN PATENT DOCUMENTS

| | | |
|---|---|---|
| KR | 10-2008-0046016 A | 5/2008 |
| KR | 10-2019-0073695 A | 6/2019 |
| KR | 10-2020-0075996 A | 6/2020 |

*Primary Examiner* — Vongsavanh Sengdara
(74) *Attorney, Agent, or Firm* — Seed IP Law Group LLP

(57) ABSTRACT

Embodiments disclose a display panel and a display device including the display panel. The display panel includes a first area in which a plurality of first pixels are disposed, a second area including a pixel area in which a plurality of second pixels are disposed and a plurality of light-transmitting areas disposed between the plurality of second pixels, and a polarizing plate including a plurality of first light-transmitting patterns disposed in the plurality of light-transmitting areas, wherein, in the polarizing plate, an area in which the first light-transmitting patterns are formed has a higher light transmittance than a remaining area in which the first light-transmitting patterns are not formed.

20 Claims, 21 Drawing Sheets

(56) References Cited

U.S. PATENT DOCUMENTS

| | | | |
|---|---|---|---|
| 2021/0306584 A1* | 9/2021 | Moriyama | G02B 5/3025 |
| 2022/0190043 A1* | 6/2022 | Ge | H10K 50/865 |
| 2023/0006156 A1* | 1/2023 | Gong | H10K 71/00 |
| 2023/0092986 A1* | 3/2023 | Rieutort-Louis | H10K 77/10 |
| | | | 257/40 |

* cited by examiner

【FIG. 1】
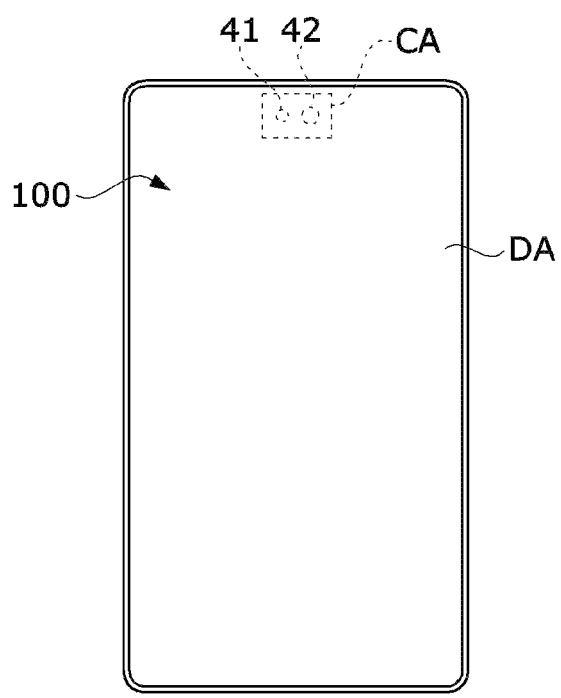
【FIG. 2a】
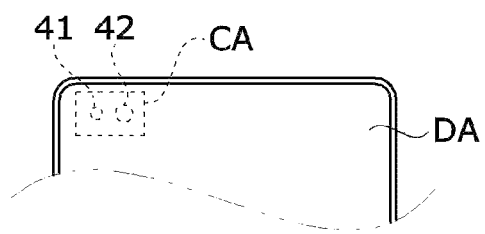

【FIG. 2b】
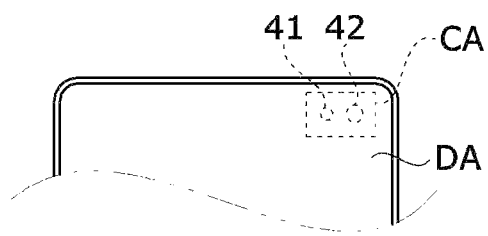
【FIG. 2c】
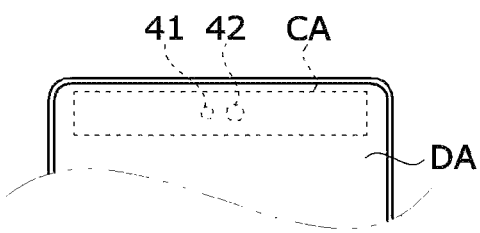
【FIG. 2d】
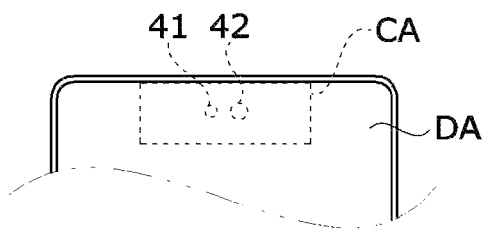

[FIG. 3]
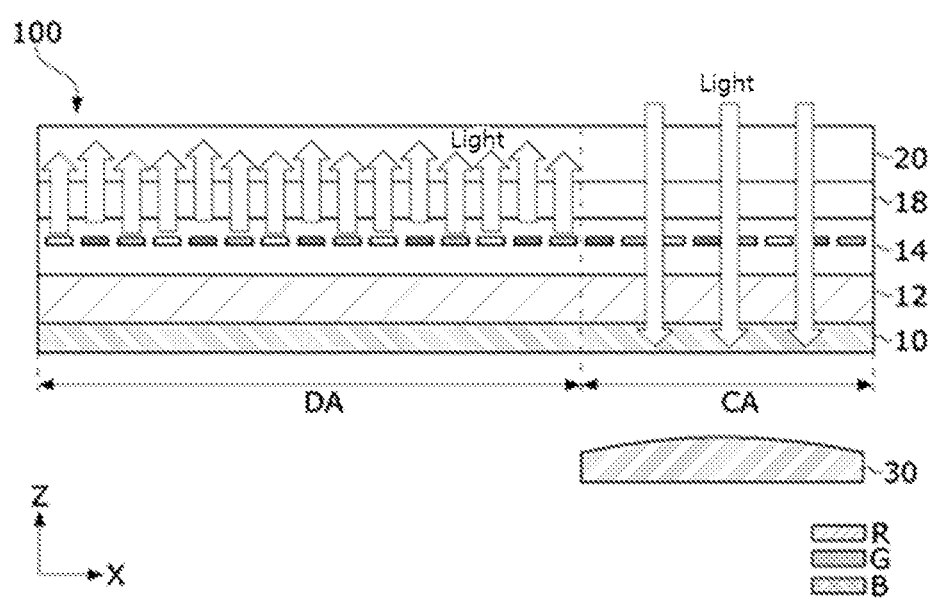

[FIG. 4]
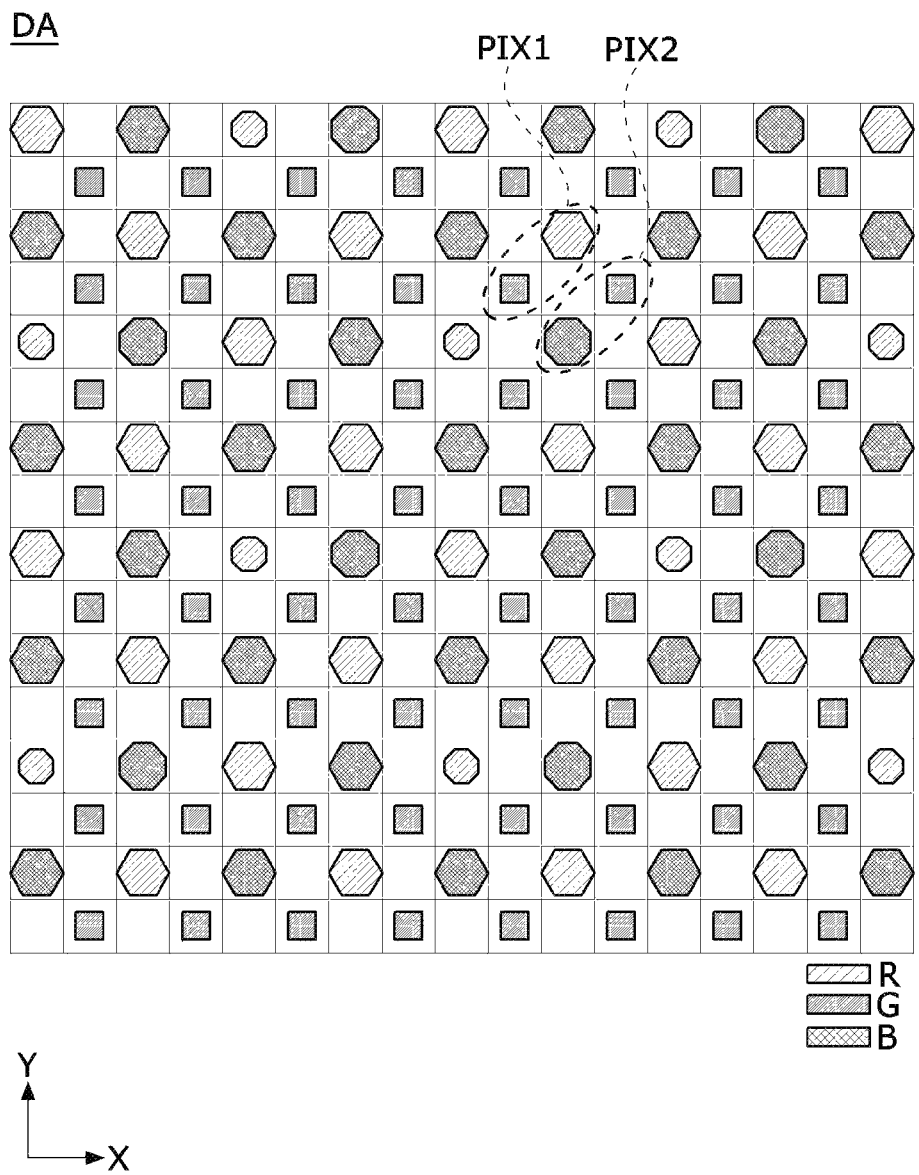

[FIG. 5a]
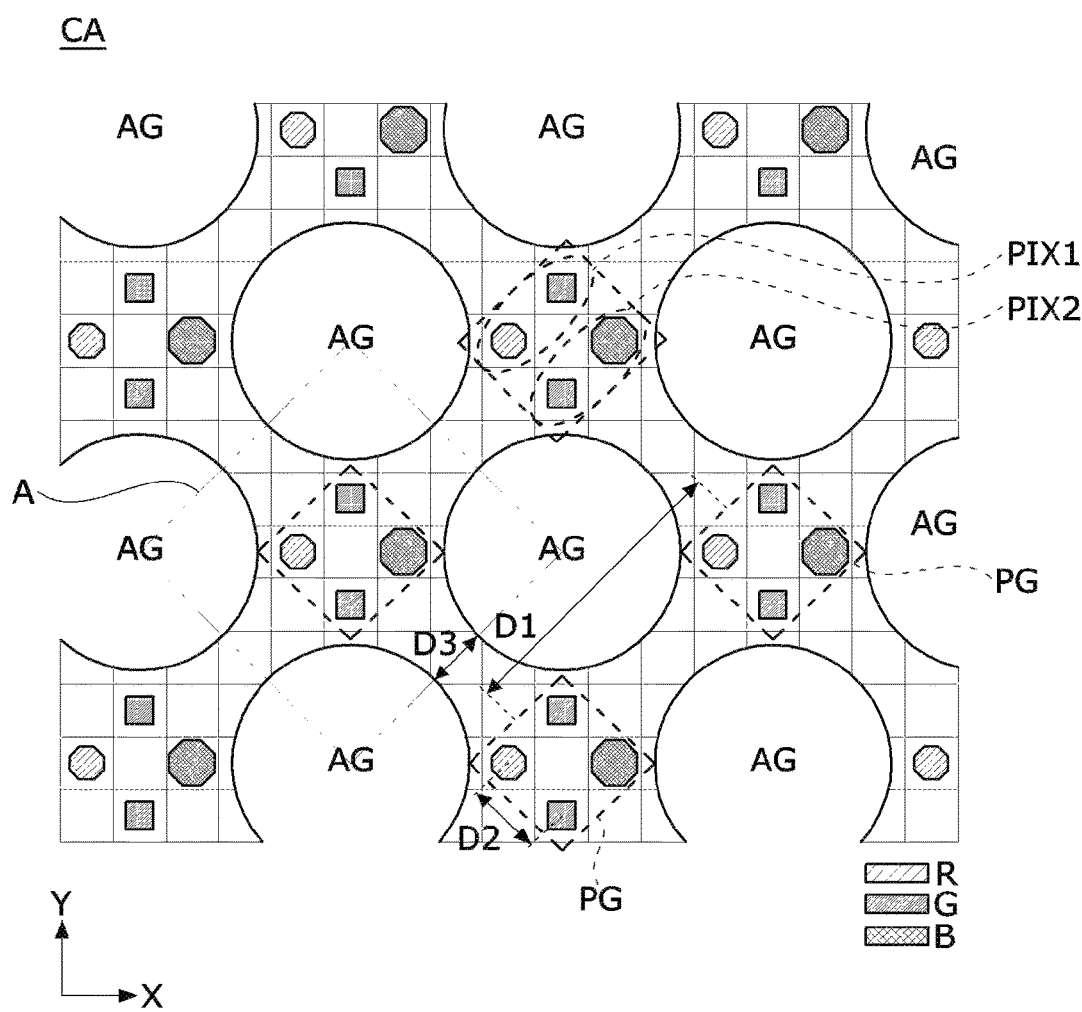

【FIG. 5b】
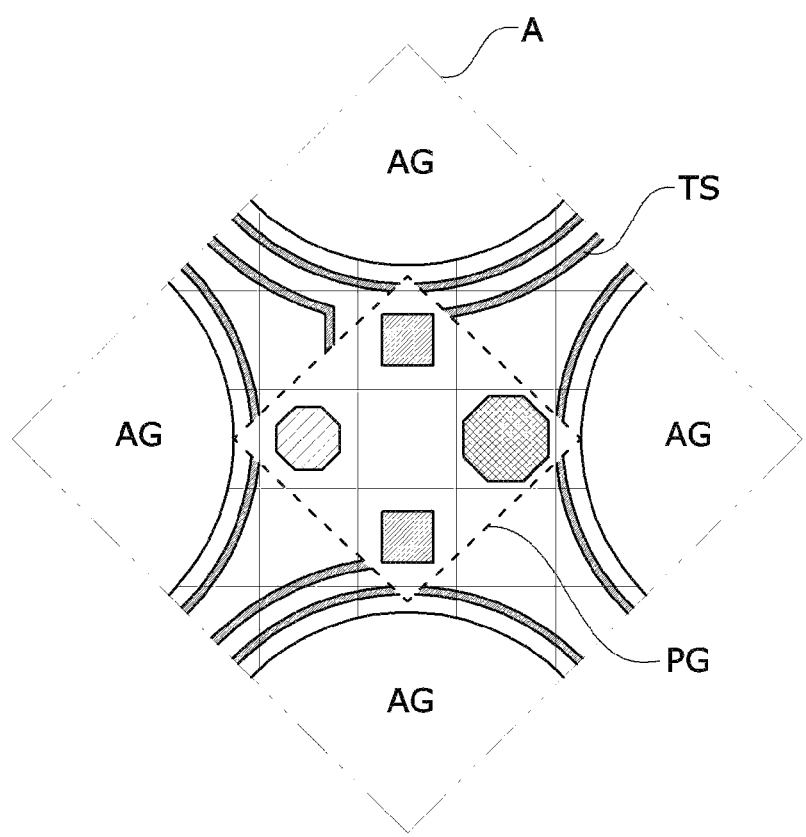

[FIG. 6]
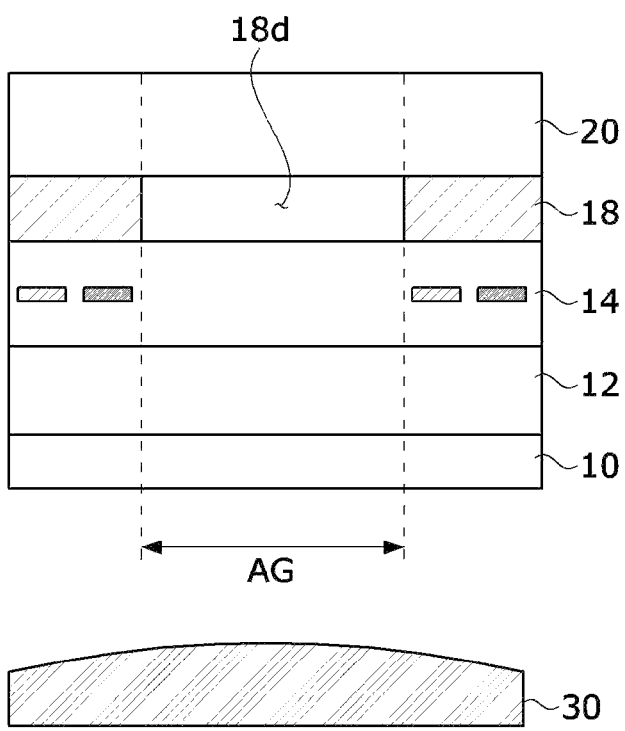

[FIG. 7]
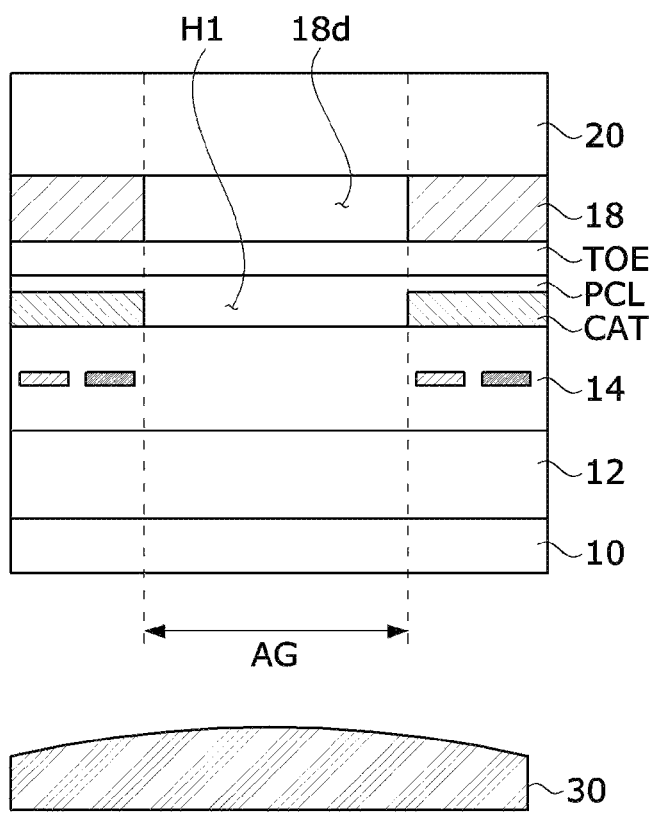
[FIG. 8a]
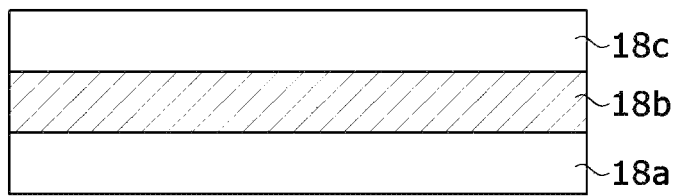

【FIG. 8b】
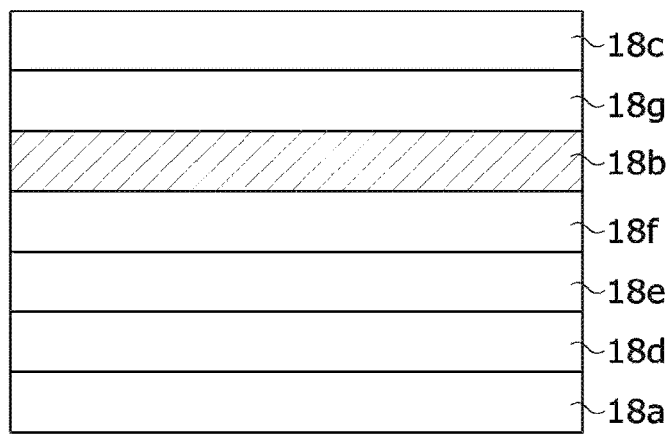
【FIG. 9】
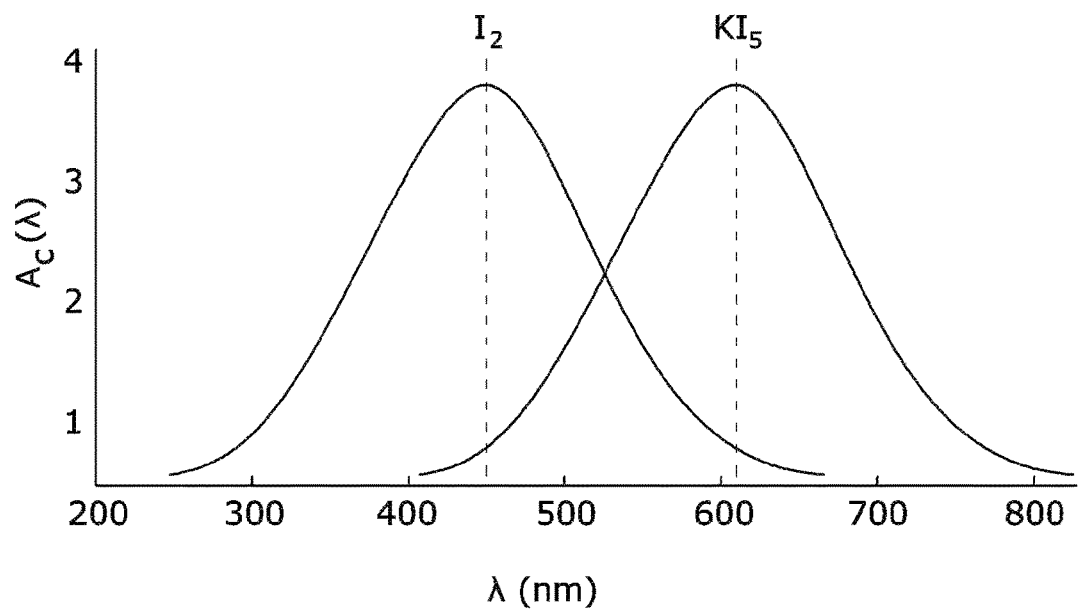

[FIG. 10]
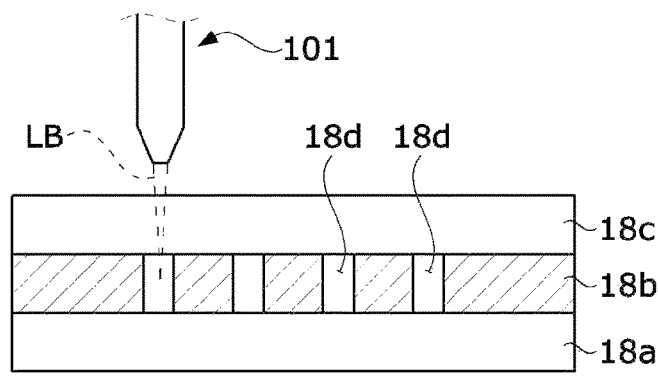
[FIG. 11]
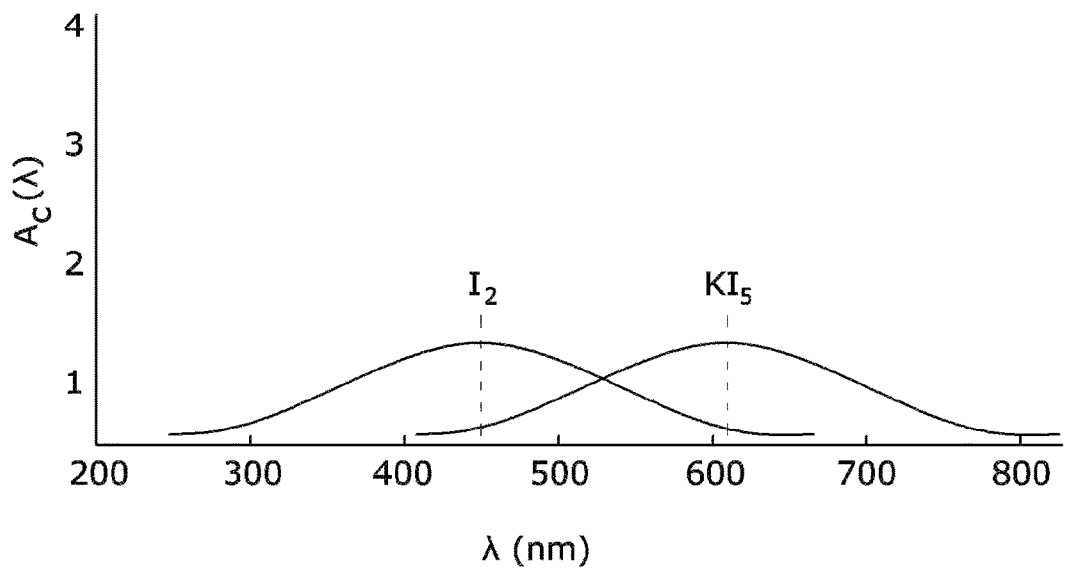

[FIG. 12]
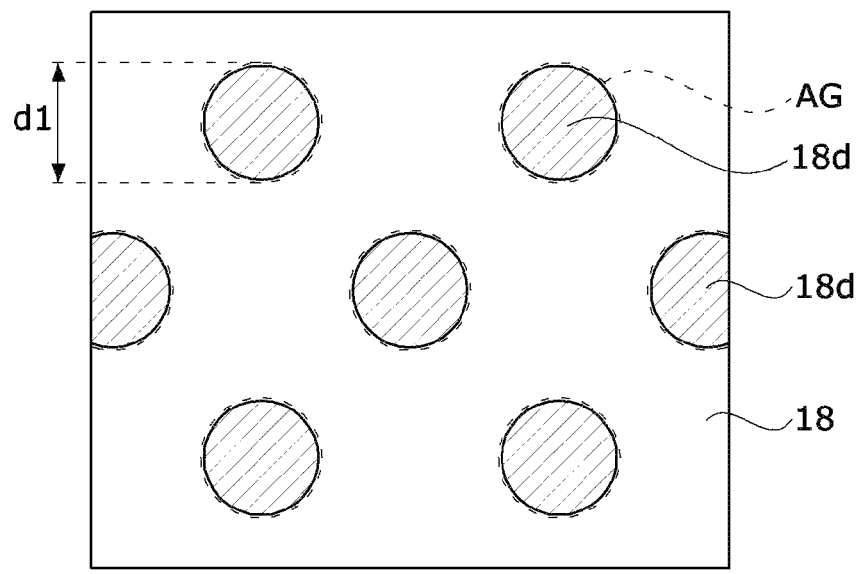
[FIG. 13]
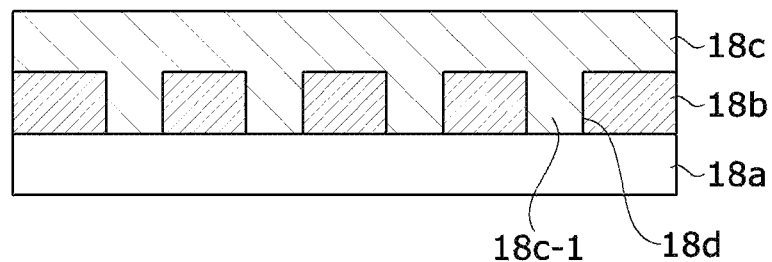

[FIG. 14]
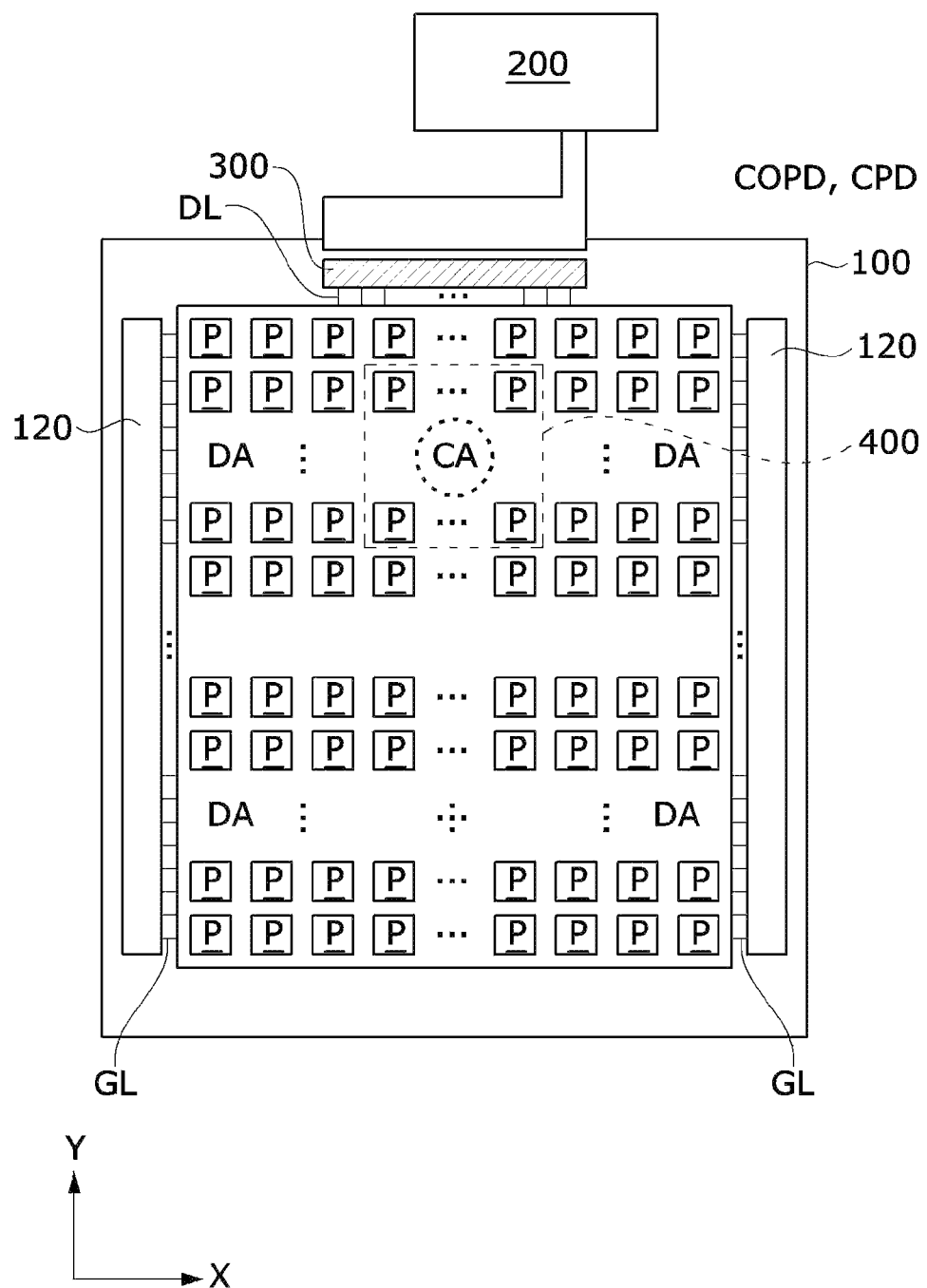

[FIG. 15]
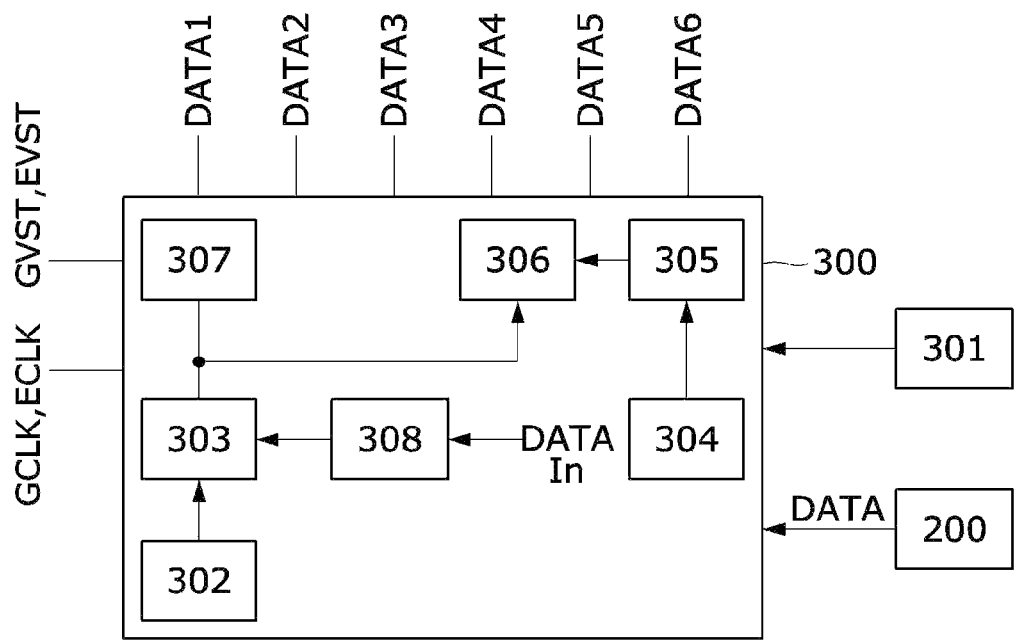

[FIG. 16]
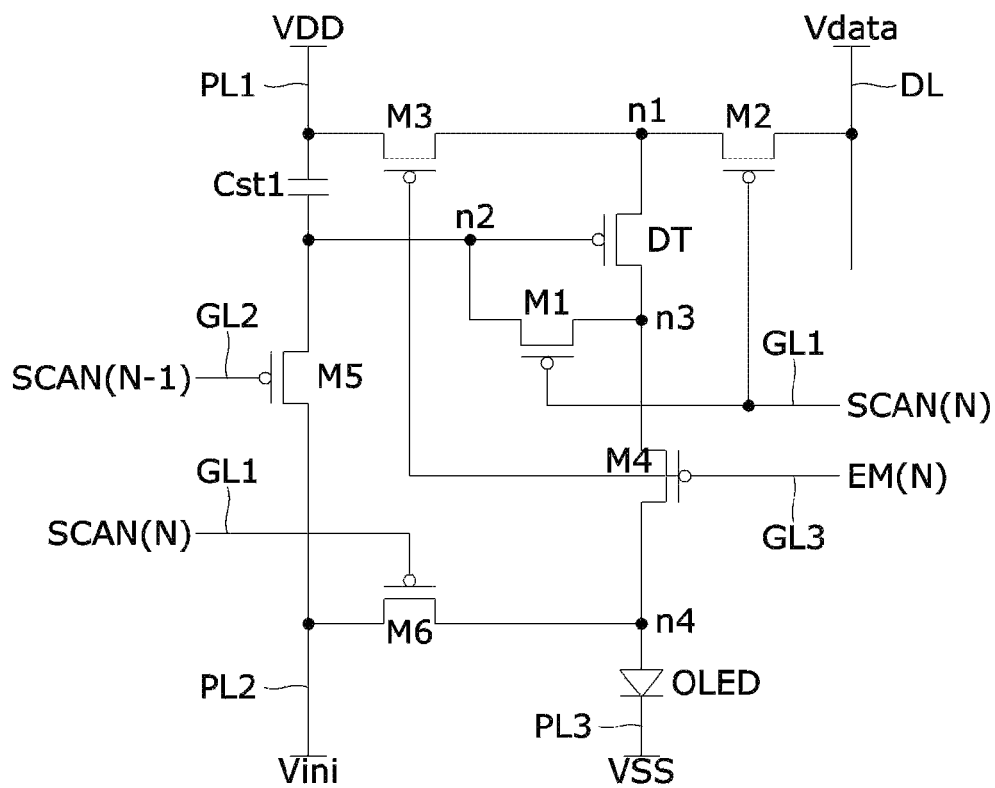

[FIG. 17]
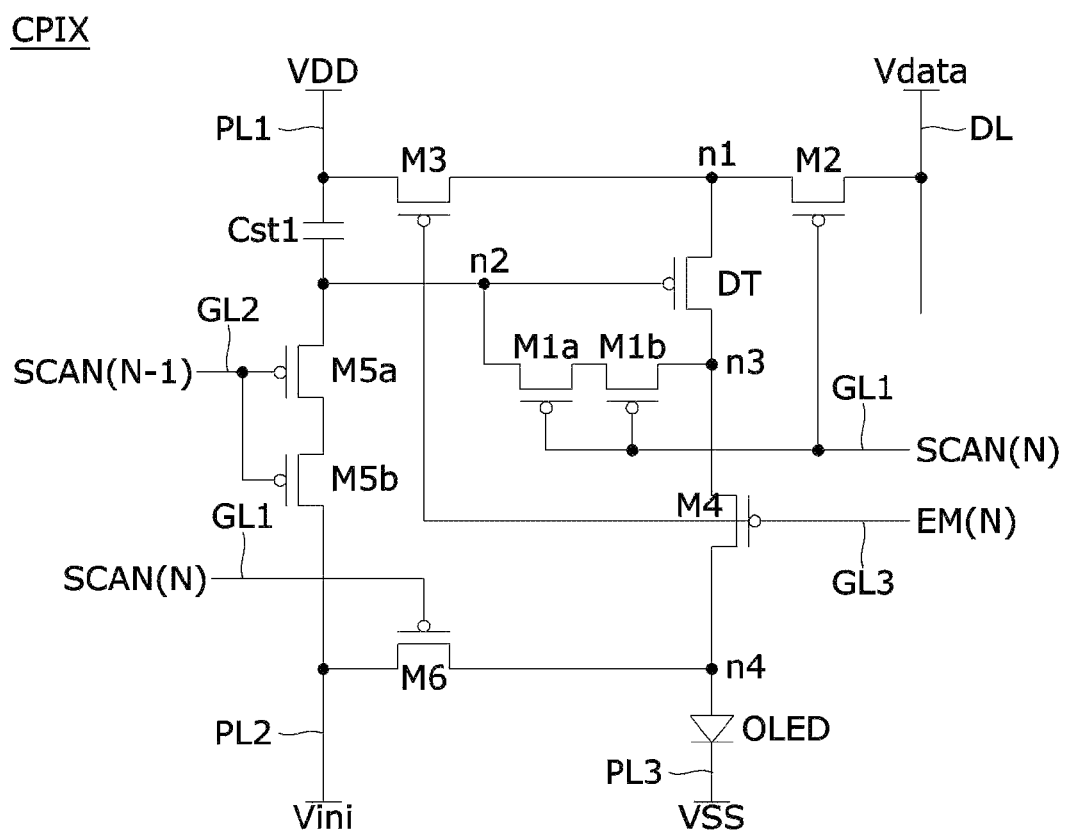

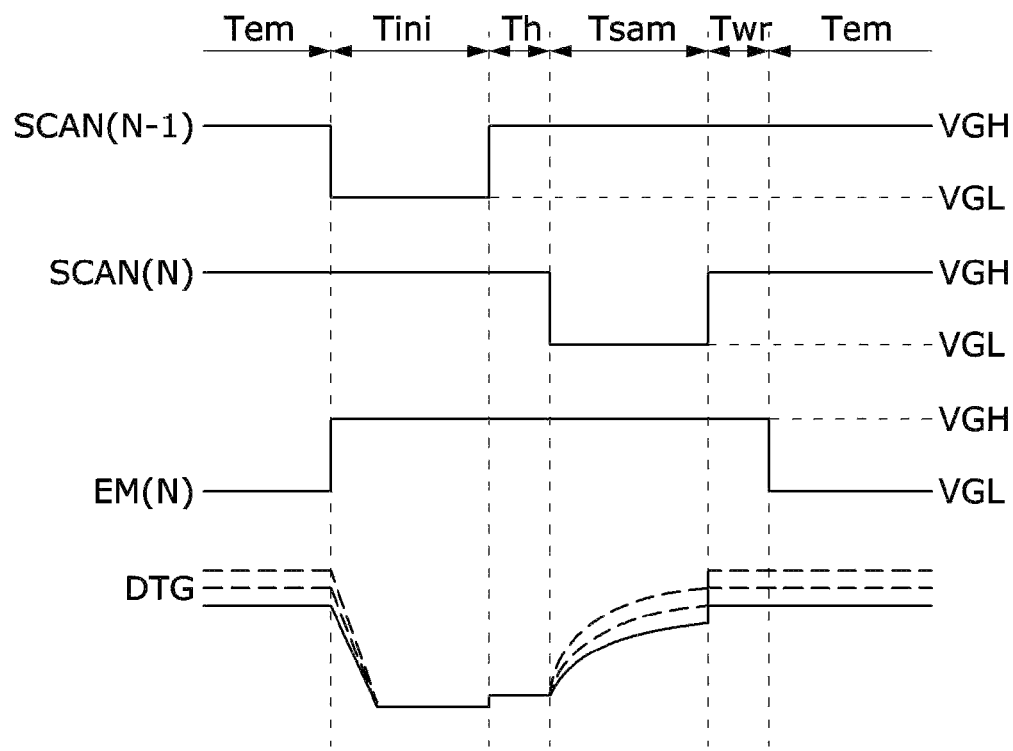
[FIG. 18]

[FIG. 19]
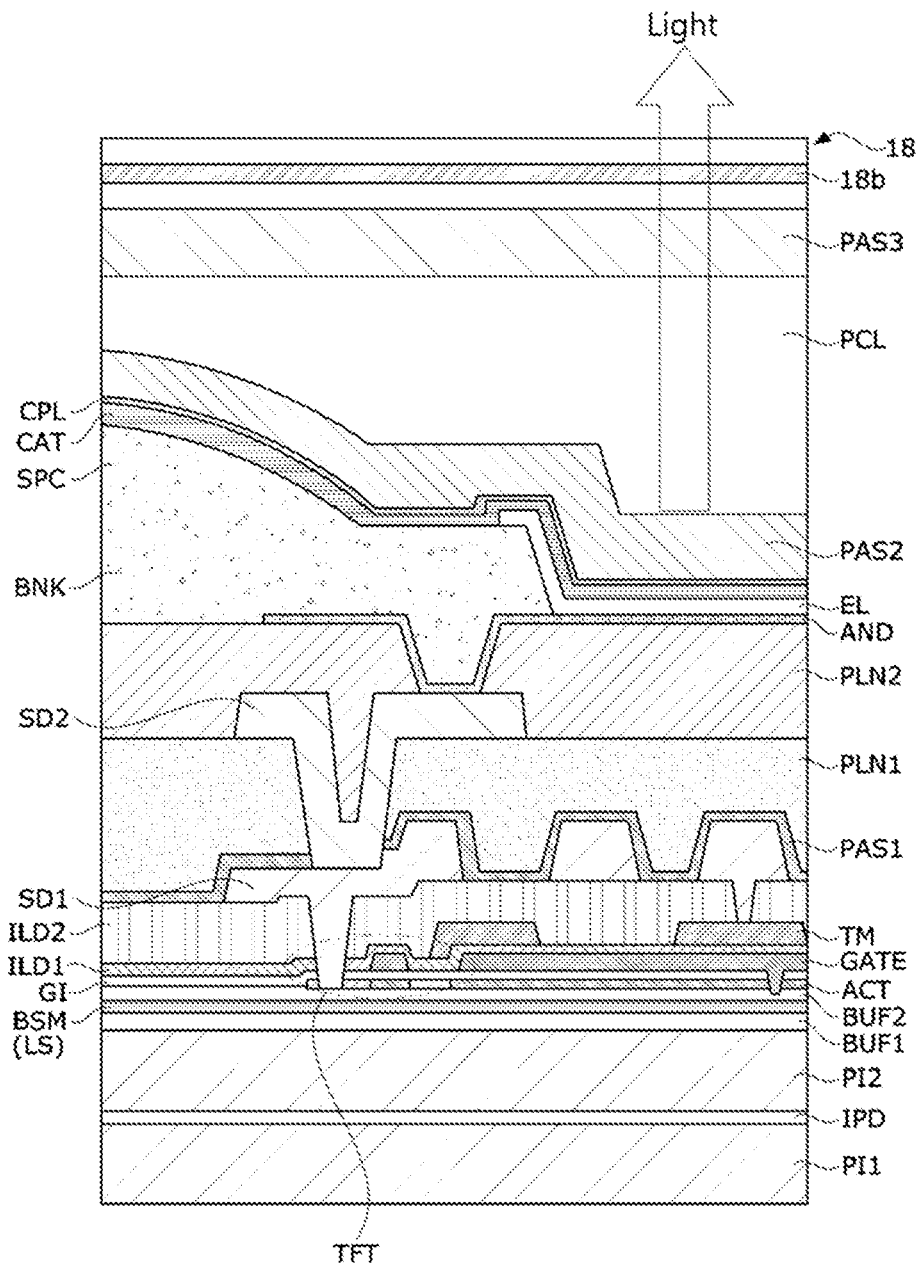

[FIG. 20]
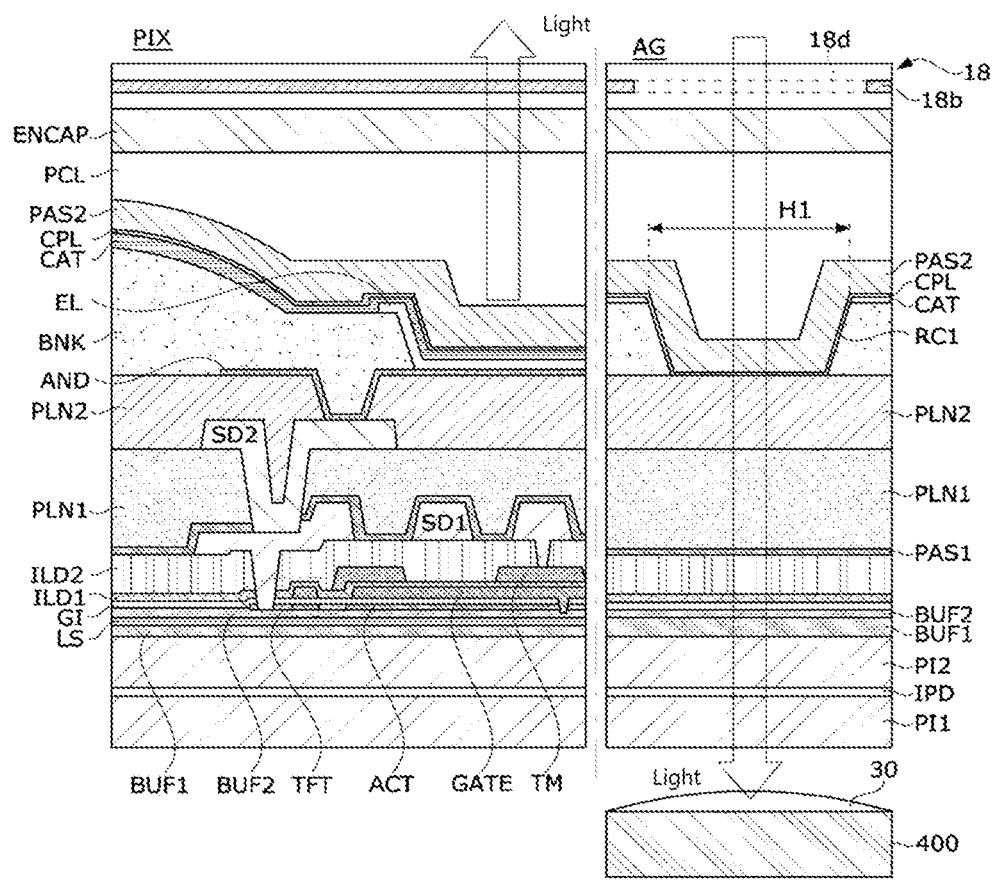

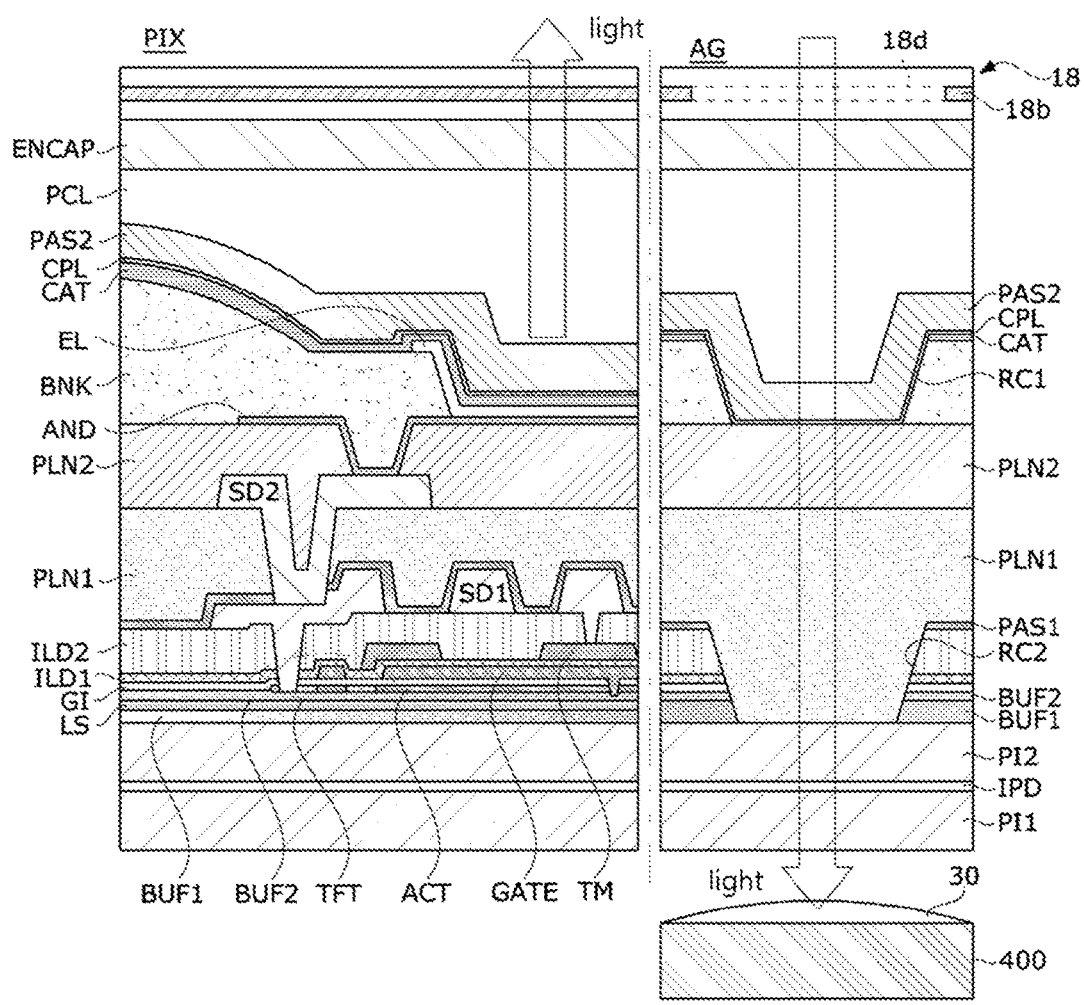
[FIG. 21]

[FIG. 22]
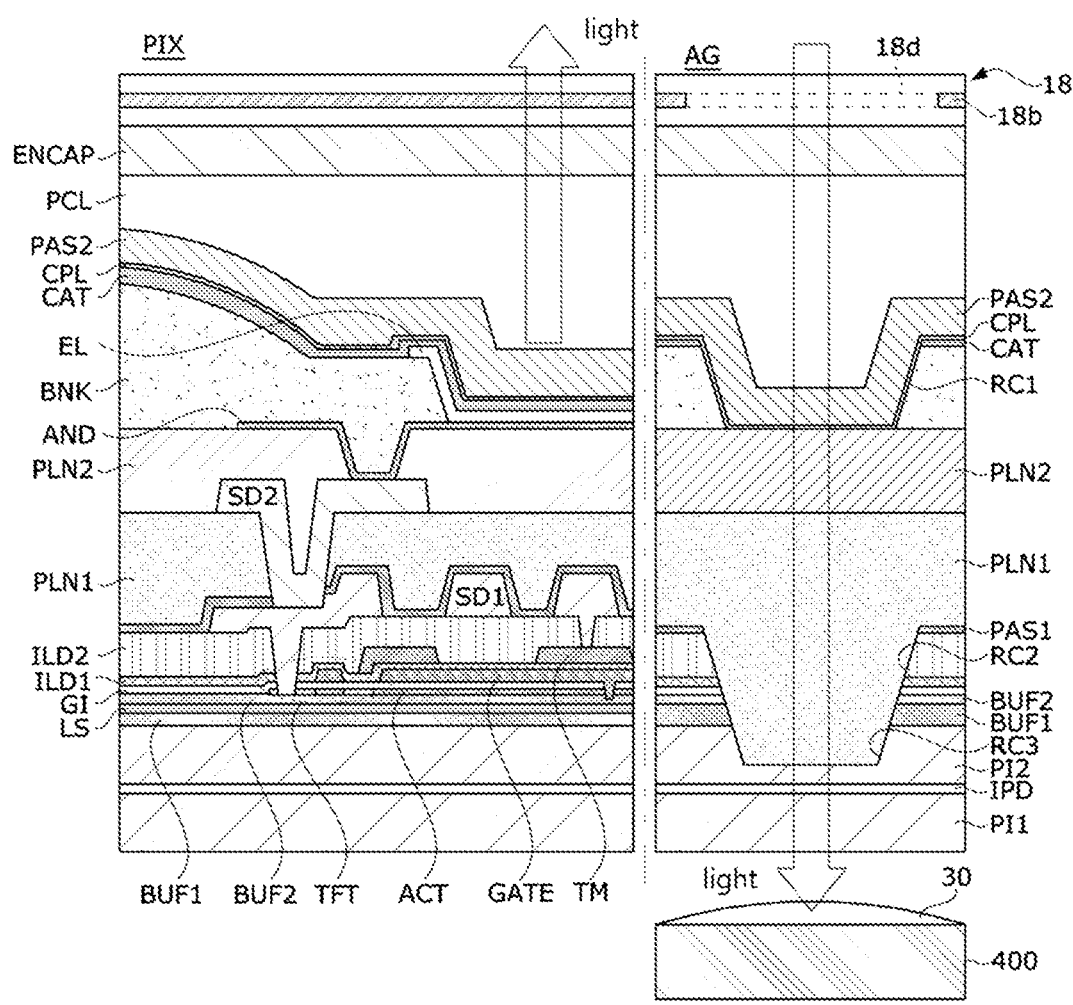

[FIG. 23]
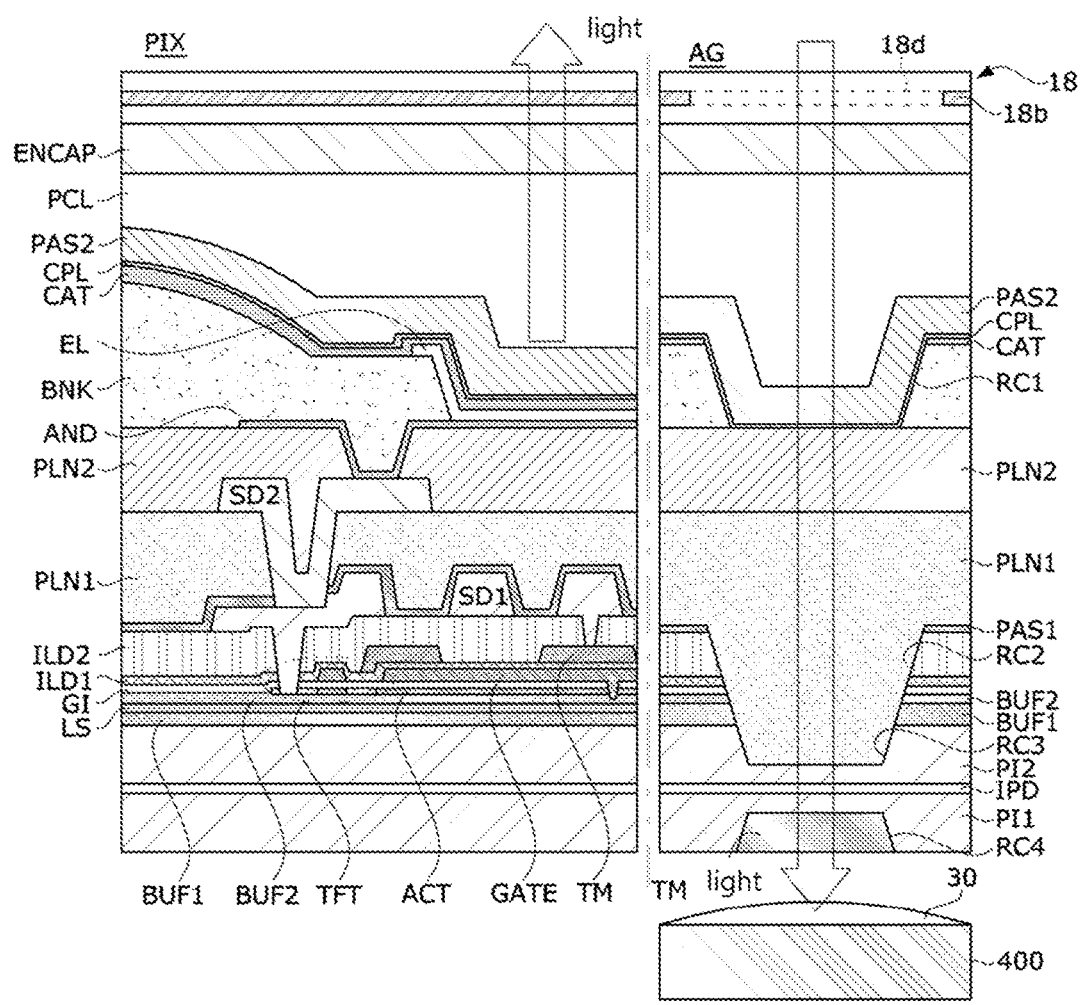

DISPLAY PANEL AND DISPLAY DEVICE INCLUDING THE SAME

CROSS-REFERENCE TO RELATED APPLICATION

This application claims priority to and the benefit of Korean Patent Application No. 10-2020-0080190, filed on Jun. 30, 2020 the disclosure of which is incorporated herein by reference in its entirety.

BACKGROUND

Technical Field

An embodiment relates to a display panel and a display device including the same.

Description of the Related Art

Electroluminescence display devices are classified into inorganic light-emitting display devices and organic light-emitting display devices depending on materials of a light-emitting layer. An active-matrix-type organic light-emitting display device includes an organic light-emitting diode (OLED) that emits light by itself and has advantages in terms of a quick response time, high light emission efficiency, high luminance, and a wide viewing angle. The organic light-emitting display device has OLEDs formed in each pixel. The organic light-emitting display device may represent a black grayscale as perfect black as well as having a quick response time, high light emission efficiency, high luminance, and a wide viewing angle, and thus has an excellent contrast ratio and color gamut.

Multimedia functions of a mobile terminal have been improved. For example, a camera is basically built into a smart phone and the resolution of the camera is increasing to a level of an existing digital camera. However, a front camera of the smart phone limits the design of a screen, thereby making it difficult to design the screen. In order to reduce the space occupied by the camera, a screen design including a notch or a punch hole has been adopted in the smart phone, but it is difficult to implement a full-screen display because a screen size is still limited due to the camera.

In order to implement a full-screen display, a method of preparing an imaged area, in which low-resolution pixels are disposed in a screen of a display panel, and disposing a camera and/or various sensors at a position under the display panel which faces the imaged area has been proposed.

BRIEF SUMMARY

The inventors of the present disclosure have recognized that since the pixels are disposed in the imaged area, there is a problem that light transmittance is relatively lowered, and performance of the camera and/or the various sensors are degraded. One or more embodiments of the present disclosure have been devised by the inventors to address the above problems identified in the related art as well as other problems not mentioned above in the related art.

Embodiments provide a display panel and a display device capable of improving light transmittance of an imaged area.

It should be noted that technical benefits of the present disclosure are not limited to the above-described benefits, and other benefits of the present disclosure will be apparent to those skilled in the art from the following descriptions.

According to an aspect of the present disclosure, there is provided a display panel including a first area in which a plurality of first pixels are disposed, a second area including a pixel area in which a plurality of second pixels are disposed and a plurality of light-transmitting areas disposed between the plurality of second pixels, and a polarizing plate including a plurality of first light-transmitting patterns disposed in the plurality of light-transmitting areas, wherein, in the polarizing plate, an area in which the first light-transmitting patterns are formed has a higher light transmittance than the remaining area.

A resolution of the plurality of second pixels disposed in the second area may be lower than a resolution of the plurality of first pixels disposed in the first area.

The second area may be disposed at a position overlapping a camera module.

The polarizing plate may include a first protective layer, a second protective layer, and a polarizer disposed between the first protective layer and the second protective layer, and the plurality of first light-transmitting patterns may be formed in the polarizer.

Each of the plurality of first light-transmitting patterns may include a through-hole formed in the polarizer.

The first protective layer may include a protrusion inserted into the through-hole.

Each of the plurality of light-transmitting areas may include a discolored area formed in the polarizer.

The discolored area may be an area in which an iodine compound of the polarizer is decomposed.

The pixel area may include a circuit layer disposed on a substrate, a first electrode layer disposed on the circuit layer, a light-emitting element layer disposed on the first electrode layer, and a second electrode layer disposed on the light-emitting element layer, and the second electrode layer may include a through-hole formed in each of the light-transmitting areas.

According to another aspect of the present disclosure, there is provided a display device including a display panel including a first area in which a plurality of first pixels are disposed, a second area including a pixel area in which a plurality of second pixels are disposed and a plurality of light-transmitting areas disposed between the plurality of second pixels, and a polarizing plate including a plurality of first light-transmitting patterns disposed in the plurality of light-transmitting areas, and at least one sensor disposed under the second area, wherein, in the polarizing plate, an area in which the first light-transmitting patterns are formed has a higher light transmittance than the remaining area.

BRIEF DESCRIPTION OF THE SEVERAL VIEWS OF THE DRAWINGS

The above and other features, and advantages of the present disclosure will become more apparent to those of ordinary skill in the art by describing embodiments thereof in detail with reference to the accompanying drawings, in which:

FIG. 1 is a conceptual diagram of a display device according to one embodiment of the present disclosure;

FIGS. 2a to 2d are views illustrating various arrangement positions and shapes of a second area;

FIG. 3 is a schematic cross-sectional view illustrating a display panel according to the embodiment of the present disclosure;

FIG. 4 is a view illustrating a pixel arrangement in a display area according to one embodiment of the present disclosure;

FIG. 5a is a view illustrating pixels of an imaged area and light-transmitting areas according to one embodiment of the present disclosure;

FIG. 5b is an enlarged view of portion A of FIG. 5a;

FIG. 6 is a schematic view illustrating a structure of the display panel of the imaged area;

FIG. 7 is a modified example of FIG. 6;

FIGS. 8a and 8b are views illustrating various structures of a polarizing plate;

FIG. 9 is a graph illustrating an absorption spectrum of the polarizing plate;

FIG. 10 is a view illustrating a polarizing plate according to one embodiment;

FIG. 11 is a graph illustrating an absorption spectrum of the polarizing plate in which a first light-transmitting pattern is formed;

FIG. 12 is a plan view of the first light-transmitting pattern;

FIG. 13 is a view illustrating a polarizing plate according to another embodiment;

FIG. 14 is a block diagram illustrating a display panel and a display panel driving unit according to an embodiment of the present disclosure;

FIG. 15 is a schematic block diagram illustrating a configuration of a driver integrated circuit (IC);

FIG. 16 is a circuit diagram illustrating an example of a pixel circuit;

FIG. 17 is a circuit diagram illustrating another example of the pixel circuit;

FIG. 18 is a diagram illustrating a method of driving the pixel circuits shown in FIGS. 16 and 17;

FIG. 19 is a cross-sectional view illustrating a cross-sectional structure of a pixel area in detail in a display panel according to one embodiment of the present disclosure;

FIG. 20 illustrates a cross-sectional structure of the pixel area and a light-transmitting area according to one embodiment of the present disclosure;

FIG. 21 illustrates a first modified example of FIG. 20;

FIG. 22 illustrates a second modified example of FIG. 20; and

FIG. 23 illustrates a third modified example of FIG. 20.

DETAILED DESCRIPTION

Advantages and features of the present disclosure and implementation methods thereof will be clarified through the following embodiments described with reference to the accompanying drawings. However, the present disclosure is not limited to the embodiments described below and may be embodied with a variety of different modifications. The embodiments are merely provided to allow those skilled in the art to completely understand the scope of the present disclosure.

The figures, dimensions, ratios, angles, numbers, and the like disclosed in the drawings for describing the embodiments of the present disclosure are merely illustrative and are not limited to matters shown in the present disclosure. Throughout the disclosure, like reference numerals refer to like elements. Further, in describing the present disclosure, detailed descriptions of well-known technologies will be omitted when it is determined that they may unnecessarily obscure the gist of the present disclosure.

Terms such as "including," "having," and "composed of" used herein are intended to allow other elements to be added unless the terms are used with the term "only." Any references to the singular may include the plural unless expressly stated otherwise.

Components are interpreted to include an ordinary error range even if not expressly stated.

For description of a positional relationship, for example, when the positional relationship between two parts is described as "on," "above," "below," and "next to," etc., one or more parts may be interposed therebetween unless the term "immediately" or "directly" is used in the expression.

In the description of embodiments, the terms "first," "second," and the like may be used herein to describe various elements, the elements are not limited by the terms. These terms are used only to distinguish one component from another. Therefore, a first component discussed below could be termed a second component without departing from the teachings of the present disclosure.

In the description of related embodiments, the term "unit" may include any electrical circuitry, features, components, an assembly of electronic components or the like. That is, "unit" may include any processor-based or microprocessor-based system including systems using microcontrollers, integrated circuit, chip, microchip, reduced instruction set computers (RISC), application specific integrated circuits (ASICs), field-programmable gate arrays (FPGAs), graphical processing units (GPUs), logic circuits, and any other circuit or processor capable of executing the various operations and functions described herein. The above examples are examples only, and are thus not intended to limit in any way the definition or meaning of the term "unit."

In some embodiments, the various units described herein may be included in or otherwise implemented by processing circuitry such as a microprocessor, microcontroller, or the like.

Throughout the disclosure, like reference numerals refer to like elements.

The features of various embodiments may be partially or entirely bonded to or combined with each other. The embodiments may be interoperated and performed in technically various ways and may be carried out independently of or in association with each other.

Hereinafter, various embodiments of the present disclosure will be described in detail with reference to the accompanying drawings.

FIG. 1 is a conceptual diagram of a display device according to one embodiment of the present disclosure, FIGS. 2a to 2d are views illustrating various arrangement positions and shapes of a second area, FIG. 3 is a schematic cross-sectional view illustrating a display panel according to the embodiment of the present disclosure, and FIG. 4 is a view illustrating a pixel arrangement of a display area according to one embodiment of the present disclosure.

Referring to FIG. 1, the display device may include a display panel 100 and a case, and a front surface of the display panel 100 may be configured as a display area. Thus, a full-screen display may be implemented.

The display area may include a first area DA and a second area CA. The first area DA and the second area CA may all output an image but may be different in resolution. For example, a resolution of a plurality of second pixels disposed in the second area CA may be lower than a resolution of a plurality of first pixels disposed in the first area DA. A sufficient amount of light may be injected into sensors 41 and 42 disposed in the second area CA by as much as the resolution lowered in the plurality of second pixels disposed in the second area CA.

However, the present disclosure is not limited thereto, and the resolution of the first area DA and the resolution of the second area CA may be the same as long as the second area CA may have a sufficient light transmittance or an appropriate noise compensation algorithm may be implemented.

The second area CA may be an area in which the sensors 41 and 42 are disposed. The second area CA is an area that overlaps various sensors and thus may be smaller in area than that of the first area DA outputting most of the image.

The sensors 41 and 42 may include at least one of an image sensor, a proximity sensor, an illumination sensor, a gesture sensor, a motion sensor, a fingerprint recognition sensor, and a biometric sensor. As an example, a first sensor 41 may be an illumination sensor and a second sensor 42 may be an image sensor configured to capture an image or a video, but the present disclosure is not necessarily limited thereto.

Referring to FIGS. 2a to 2d, the second area CA may be disposed at various portions to which the light needs to be incident. As an example, the second area CA may be disposed on a left upper end of the display area as shown in FIG. 2a, the second area CA may be disposed on a right upper end of the display area as shown in FIG. 2b, the second area CA may be disposed on an entire upper end of the display area as shown in FIG. 2c, and a width of the second area CA may be variously modified as shown in FIG. 2d. However, the present disclosure is not necessarily limited thereto, and the second area CA may be disposed at a central portion of the display area or disposed on a lower end of the display area.

In the following description, the first area DA may be described as being a display area and the second area CA may be described as being an imaged area.

Referring to FIGS. 3 and 4, the display area DA and the imaged area CA may include a pixel array in which pixels, to which pixel data is written, may be disposed. The number of pixels per unit area (pixels per inch (PPI)) of the imaged area CA may be lower than that of the display area DA in order to ensure the light transmittance of the imaged area CA.

The pixel array of the display area DA may include a pixel area (a first pixel area) in which a plurality of pixels having a high PPI are disposed. The pixel array of the imaged area CA may include a pixel area (a second pixel area) in which a plurality of pixel groups having a relatively low PPI are disposed by being spaced apart from each other by light-transmitting areas. In the imaged area CA, external light may pass through the display panel 100 through the light-transmitting areas having a high light transmittance and may be received by a sensor placed under the display panel 100.

Since both the display area DA and the imaged area CA include the pixels, an input image may be reproduced on the display area DA and the imaged area CA.

Each of the pixels of the display area DA and the imaged area CA may include sub-pixels having different colors to implement a color of an image. The sub-pixels may include a red sub-pixel (hereinafter referred to as an "R sub-pixel"), a green sub-pixel (hereinafter referred to as a "G sub-pixel"), and a blue sub-pixel (hereinafter referred to as a "B sub-pixel"). Although not shown in the drawings, each of the pixels may further include a white sub-pixel (hereinafter, referred to as a "W sub-pixel"). Each of the sub-pixels may include a pixel circuit and a light-emitting element (organic light-emitting diode: OLED).

The imaged area CA may include the pixels and a camera module disposed under a screen of the display panel 100. The pixels of the imaged area CA may display an input image by writing pixel data of an input image in a display mode.

The camera module may capture an external image in an imaged mode to output a picture or video image data. A lens of the camera module may face the imaged area CA. The external light is incident on a lens 30 of the camera module through the imaged area CA, and the lens 30 may condense light to an image sensor that is omitted from the drawing. The camera module may capture the external image in the imaged mode to output a picture or video image data.

In order to ensure the light transmittance, due to the pixels removed from the imaged area CA, an image quality compensation algorithm for compensating for luminance and color coordinates of the pixels in the imaged area CA may be applied.

In the present disclosure, low-resolution pixels may be disposed in the imaged area CA. Thus, the display area of the screen is not restricted due to the camera module so that a full-screen display may be implemented.

The display panel 100 has a width in an X-axis direction, a length in a Y-axis direction, and a thickness in a Z-axis direction. The display panel 100 may include a circuit layer 12 disposed on a substrate 10, and a light-emitting element layer 14 disposed on the circuit layer 12. A polarizing plate 18 may be disposed on the light-emitting element layer 14, and a cover glass 20 may be disposed on the polarizing plate 18.

The circuit layer 12 may include the pixel circuit connected to lines such as data lines, gate lines, power lines, and the like, a gate driving unit connected to the gate lines, and the like. The circuit layer 12 may include a circuit element such as a transistor implemented as a thin-film transistor (TFT), a capacitor, and the like. The lines and circuit elements of the circuit layer 12 may be implemented with a plurality of insulating layers, two or more metal layers separated from each other with the insulating layers therebetween, and an active layer including a semiconductor material.

The light-emitting element layer 14 may include the light-emitting element driven by the pixel circuit. The light-emitting element may be implemented as an OLED. The OLED may include an organic compound layer formed between an anode and a cathode. The organic compound layer may include a hole injection layer HIL, a hole transport layer HTL, an emission layer EML, an electron transport layer ETL, and an electron injection layer EIL, but the present disclosure is not limited thereto. When a voltage is applied to the anode and the cathode of the OLED, holes passing through the hole transport layer HTL and electrons passing through the electron transport layer ETL move to the emission layer EML to create excitons, and thus visible light may be emitted from the emission layer EML. The light-emitting element layer 14 may further include a color filter array disposed on the pixels that selectively transmit red, green, and blue wavelengths.

The light-emitting element layer 14 may be covered by a protective film, and the protective film may be covered by an encapsulation layer. The protective film and the encapsulation layer may have a structure in which organic films and inorganic films are alternately stacked. The inorganic films may block the penetration of moisture or oxygen. The organic films may planarize a surface of the inorganic film. When the organic films and the inorganic films are stacked in multiple layers, the penetration of moisture/oxygen affecting the light-emitting element layer 14 may be effectively blocked since a movement path of the moisture or oxygen is increased in length as compared with a single layer.

The polarizing plate 18 may be adhered to the encapsulation layer. The polarizing plate 18 can improve the outdoor visibility of the display device. The polarizing plate 18 may reduce the reflection of light from a surface of the display panel 100 and block light reflected from metal of the circuit layer 12, thereby improving the brightness of the pixels. The polarizing plate 18 may be implemented as a polarizing plate to which a linear polarizing plate and a phase retardation film are bonded, or a circular polarizing plate.

Referring to FIG. 4, the display area DA may include pixels PIX1 and PIX2 arranged in a matrix form. Each of the pixels PIX1 and PIX2 may be implemented as a real-type pixel in which R, G, and B sub-pixels of three primary colors form one pixel.

Each of the pixels PIX1 and PIX2 may further include a W sub-pixel omitted from the drawing. In addition, two sub-pixels may form one pixel using a sub-pixel rendering algorithm. For example, a first pixel PIX1 may include R and G sub-pixels, and a second pixel PIX2 may include B and G sub-pixels. Insufficient color representation in each of the pixels PIX1 and PIX2 may be compensated with an average value of pieces of corresponding color data between neighboring pixels.

FIG. 5a is a view illustrating the pixels of the imaged area and the light-transmitting areas according to one embodiment of the present disclosure, and FIG. 5b is an enlarged view of portion A of FIG. 5a.

Referring to FIGS. 5a and 5b, a plurality of light-transmitting areas AG may be disposed between the plurality of second pixels. Specifically, the imaged area CA may include pixel groups PG spaced apart from each other by a selected distance D1, and the light-transmitting areas AG each disposed between adjacent pixel groups PG. In some embodiments, the imaged area CA may include pixel groups PG spaced apart from each other by a predetermined distance D1. The external light may be received through the light-transmitting areas AG to the lens of the camera module. The pixel groups PG may be disposed to be spaced apart from each other in the pixel area.

The light-transmitting area AG may include transparent media having a high light transmittance without having metal so that light may be incident at a minimum light loss. The light-transmitting area AG may be made of transparent insulating materials without including metal lines or pixels. As the light-transmitting area AG becomes larger, the light transmittance of the imaged area CA may be higher.

Each of the pixel groups PG may include one or two pixels. Each of the pixels of the pixel group may include two to four sub-pixels. For example, the first pixel in the pixel group may include R, G, and B sub-pixels or include two sub-pixels, and may further include a W sub-pixel.

A distance D3 between the light-transmitting areas AG may be less than a pitch D1 between the pixel groups PG. An interval D2 between the sub-pixels may be less than the pitch D1 between the pixel groups PG.

The shape of the light-transmitting area AG is illustrated in a circular shape, but the present disclosure is not limited thereto. For example, the light-transmitting area AG may be designed in various shapes such as a circular shape, an elliptical shape, a polygonal shape, or the like.

All of the metal electrode material may be removed from the light-transmitting area AG. Accordingly, lines TS of the pixels may be disposed outside the light-transmitting area AG. Thus, light may be effectively incident through the light-transmitting area. However, the present disclosure is not necessarily limited thereto, and the metal electrode material may remain in a portion of the light-transmitting area AG.

FIG. 6 is a schematic view illustrating a structure of the display panel of the imaged area, and FIG. 7 is a modified example of FIG. 6.

Referring to FIG. 6, the display panel may include the circuit layer 12 disposed on the substrate 10, and the light-emitting element layer 14 disposed on the circuit layer 12. The polarizing plate 18 may be disposed on the light-emitting element layer 14, and the cover glass 20 may be disposed on the polarizing plate 18.

In the polarizing plate 18, a first light-transmitting pattern 18d may be formed in an area corresponding to the light-transmitting area AG. Based on green light having a wavelength of 555 nm, a light transmittance of the substrate made of PI is about 70% to 80%, and a light transmittance of the cathode is 80% to 90%. On the other hand, a light transmittance of the polarizing plate 18 is relatively very low to about 40%. Thus, in order to effectively increase the light transmittance in light-transmitting area, it is beneficial to increase the light transmittance of the polarizing plate 18.

The polarizing plate 18 according to the embodiment has the first light-transmitting pattern 18d formed above the light-transmitting area AG to improve the light transmittance. A light transmittance of the area in which the first light-transmitting pattern 18d is formed may be higher than that of the remaining area in the polarizing plate. Thus, the amount of light introduced into the camera module in the light-transmitting area increases, thereby improving camera performance.

The first light-transmitting pattern 18d of the polarizing plate 18 may be formed by removing a portion of the polarizing plate 18 and may also be formed by decomposing a compound constituting the polarizing plate 18. That is, the first light-transmitting pattern 18d may have various structures capable of increasing the light transmittance of the conventional polarizing plate 18.

Referring to FIG. 7, in the light-transmitting area AG, the polarizing plate 18 may have the first light-transmitting pattern 18d, and a cathode CAT may have a second light-transmitting pattern. The second light-transmitting pattern may be an opening H1 formed in the light-transmitting area. Since the light transmittance of the cathode is 80% to 90%, the light transmittance of the light-transmitting area AG may be further increased due to the opening H1.

A method of forming the opening H1 in the cathode CAT is not particularly limited. As an example, after the cathode is formed, the opening H1 may be formed in the cathode using an etching process, or the cathode may be removed by irradiating an infra-red (IR) laser from a lower portion of the substrate 10.

A planarization layer PCL may be formed on the cathode CAT, and a touch sensor TOE may be disposed on the planarization layer PCL. Here, in the light-transmitting area AG, a sensing electrode and lines of the touch sensor may be made of a transparent material such as indium tin oxide (ITO) or a metal mesh, thereby increasing the light transmittance.

FIGS. 8a and 8b are views illustrating various structures of the polarizing plate, and FIG. 9 is a graph illustrating an absorption spectrum of the polarizing plate.

The polarizing plate 18 may include a first protective layer 18a, a second protective layer 18c, and a polarizer 18b disposed between the first protective layer 18a and the second protective layer 18c.

The polarizer 18b may include a dichroic material. The dichroic material may include at least one of iodine and organic dyes. The organic dye may include azo-based pigments, stilbene-based pigments, pyrazolone-based pigments, triphenylmethane-based pigments, quinoline-based pigments, oxazine-based pigments, thiazine-based pigments, anthraquinone-based pigments, or the like, but the present disclosure is not necessarily limited thereto.

The polarizer 18b has a transmission axis in a direction perpendicular to a stretching direction. Iodine molecules and dye molecules exhibit a dichroic property, and thus the polarizer 18 may have a function of absorbing light vibrating in the stretching direction and transmitting light vibrating in the direction perpendicular to the stretching direction.

The polarizer 18b may have a weak mechanical strength with respect to a transmission axis direction. In addition, due to the heat or moisture, the polarizer 18b may contract or have a polarization function be weakened. The first and second protective layers 18a and 18c are configured to protect the polarizer 18b while not changing the properties of light transmitted through the polarizer 18b and may be formed using, for example, tri-acetyl cellulose (TAC). The TAC has a high light transmittance and relatively low birefringent and is easily hydrophilized by surface modification, and thus is easily stacked on the polarizer 18b.

Referring to FIG. 8B, the polarizing plate 18 may further include various functional layers 18d, 18e, 18f, and 18g disposed on upper and lower portions of the polarizer 18b. As an example, the functional layers 18d, 18e, 18f, and 18g may include a pressure-sensitive adhesive (PSA), a quarter-wave plate (QWP), and a hard coating (HC). However, most of the layers constituting the polarizing plate 18 have a relatively high light transmittance compared to the polarizer 18b. Thus, in order to increase the light transmittance of the light-transmitting area AG, it is most important to control the light transmittance of the polarizer 18b.

Referring to FIG. 9, the polarizer 18b of the polarizing plate 18 is formed of an iodine compound, and a first iodine compound ($I_2$) has a maximum absorption peak at about 450 nm, and a second iodine compound ($KI_5$) has a maximum absorption peak at about 610 nm. In the absorption spectrum of the polarizer 18b, the first iodine compound ($I_2$) and the second iodine compound ($KI_5$) have a relatively high absorption peak, therefore the absorption peaks thereof need to be lowered.

FIG. 10 is a view illustrating a process of forming a first light-transmitting pattern on a polarizing plate according to one embodiment, FIG. 11 is a graph illustrating an absorption spectrum of a polarizing plate in which the first light-transmitting pattern is formed, FIG. 12 is a plan view of the first light-transmitting pattern, and FIG. 13 is a view illustrating a structure in which a first light-transmitting pattern is formed on a polarizing plate according to another embodiment.

As shown in FIG. 10, when an iodine compound is irradiated with a laser in a wavelength range having a high absorption rate, the iodine compound is decomposed and the first light-transmitting pattern 18d may be formed. That is, the bonding between iodine molecules is broken, and separated iodine molecules are sublimated, and thus the first light-transmitting pattern 18d may be formed by decolorization.

As an example, when a first laser LB having a wavelength of 532 nm is irradiated, the first iodine compound ($I_2$) and the second iodine compound ($KI_5$) may be decomposed by absorbing the first laser. A laser irradiation device 101 may emit the first laser while moving through a plurality of light-transmitting areas to form the first light-transmitting pattern 18d on each of the light-transmitting areas.

With such a configuration, a single wavelength laser may be irradiated to simultaneously decompose the first iodine compound ($I_2$) and the second iodine compound ($KI_5$), thereby increasing an operation speed. Since a very large number of light-transmitting areas exist in the imaged area, it is beneficial to form a very large number of first light-transmitting patterns.

Referring to FIG. 11, it can be seen that a light absorption peak of the first iodine compound ($I_2$) and a light absorption peak of the second iodine compound ($KI_5$) become very low in a light absorption coefficient Ac. Thus, the light transmittance of the polarizer may be improved.

However, the present disclosure is not necessarily limited thereto, and a light absorption level of the polarizer may be precisely controlled by irradiating lasers having different wavelength ranges. As an example, when a second laser having a wavelength of 450 nm is irradiated, the first iodine compound ($I_2$) may be decomposed by absorbing most of the laser. Also, when a third laser having a wavelength of 610 nm is irradiated, the second iodine compound ($KI_5$) may be decomposed by absorbing most of the laser. Thus, the light absorption peak of each of the first iodine compound ($I_2$) and the second iodine compound ($KI_5$) may be effectively controlled using two lasers. In addition, the absorption peak may be precisely adjusted by adjusting the irradiation frequency and/or output of each of the second laser and the third laser.

Table 1 below illustrates the results of measuring the light transmittance of the polarizing plate before the first light-transmitting pattern 18d is formed and the light transmittance after the first light-transmitting pattern 18d is formed in blue, green, and red wavelength ranges. J&C Tech's Hazemeter (JCH-300S) was used as measurement equipment.

With the results of the measurement, it can be seen that the light transmittance was improved by 8% in the blue wavelength range and the light transmittance is improved by 15% in the green wavelength range. In addition, the light transmittance was improved by 16% in the red wavelength region. Thus, it is confirmed that the light transmittance of the polarizing plate 18 was improved due to the first light-transmitting pattern 18d. On the other hand, it is confirmed that there is little change in the light transmittance in an IR region.

TABLE 1

| | Blue (470 nm) | Green (555 nm) | Red (650 nm) | IR (940 nm) |
|---|---|---|---|---|
| Light transmittance before formation of light-transmitting pattern | 42% | 43% | 43% | 90% |
| Light transmittance after formation of light-transmitting pattern | 50% | 58% | 59% | 91% |

In this case, when the wavelength range of the irradiated laser is adjusted, it is also possible to adjust the light transmittance in the blue, green, and red wavelength ranges to be uniform. When the light transmittance of the blue is relatively lower than those of the green and the red, laser light of a blue wavelength range may be further irradiated to the polarizer. As a result, the iodine compound absorbing the light in the corresponding wavelength range is partially decomposed to improve blue light transmittance. Thus, color uniformity may be improved. Referring to FIG. 12, a size of the first light-transmitting pattern 18d of the polarizing plate 18 may correspond to that of the light-transmitting area AG. As an example, the size (width, length, or diameter) of each of the first light-transmitting pattern 18d and the light-transmitting area AG may range from 5 µm to 200 µm. When the size of the first light-transmitting pattern is less than 5 µm, the first light-transmitting pattern may be small in area, and thus the effect of improving the light transmittance may be insignificant. When the size of the first light-transmitting pattern is greater than 200 µm, the first light-transmitting pattern may be observed from the outside, and thus there is a problem that visibility is degraded.

The shape of the first light-transmitting pattern 18d is not particularly limited. As an example, the first light-transmitting pattern 18d may have a rectangular shape or a circular shape. In addition, various polygonal shapes may be provided. That is, the shape of the first light-transmitting pattern 18d may be the same or substantially the same as the shape of the light-transmitting area AG.

Referring to FIG. 13, the first light-transmitting pattern 18d of the polarizing plate 18 may include a plurality of openings. That is, the first light-transmitting pattern 18d may also be formed by partially removing the polarizer 18b. A method of partially removing the polarizer 18b is not particularly limited. As an example, the polarizer 18b may be partially removed using a semiconductor etching process and also using a laser etching process.

For example, in the polarizer 18b, a polyvinyl alcohol (PVA)-based resin film may be stretched, and the resin film may be immersed in iodine and organic dyes to arrange iodine molecules and dye molecules in a stretching direction.

The first light-transmitting pattern 18d may be formed by forming a plurality of openings in the polarizer 18b on which the stretching process has been completed. In the process of forming the second protective layer 18c on the polarizer 18b, a portion of the second protective layer 18c may be inserted into a plurality of first light-transmitting patterns 18d to form protrusions 18c-1.

FIG. 14 is a block diagram illustrating a display panel and a display panel driving unit according to an embodiment of the present disclosure, and FIG. 15 is a schematic block diagram illustrating a configuration of a driver integrated circuit (IC).

Referring to FIGS. 14 and 15, the display device may include a display panel 100 having a pixel array disposed on a screen, a display panel driving unit, and the like.

The pixel array of the display panel 100 may include data lines DL, gate lines GL intersecting the data lines DL, and pixels P arranged in a matrix form defined by the data lines DL and the gate lines GL. The pixel array may further include power lines such as a VDD line PL1, a Vini line PL2, a VSS line PL3, and the like illustrated in FIG. 17.

The pixel array may be divided into a circuit layer 12 and a light-emitting element layer 14 as shown in FIG. 2. A touch sensor array may be disposed on the light-emitting element layer 14. Each of the pixels of the pixel array may include two to four sub-pixels, as described above. Each of the sub-pixels may include a pixel circuit disposed on the circuit layer 12.

In the display panel 100, the screen on which an input image is reproduced may include a display area DA and an imaged area CA.

The sub-pixels of each of the display area DA and the imaged area CA may include the pixel circuit. The pixel circuit may include a driving element configured to supply current to a light-emitting element OLED, a plurality of switch elements configured to sample a threshold voltage of the driving element and switch current paths of the pixel circuit, a capacitor configured to maintain a gate voltage of the driving element, and the like. The pixel circuit may be disposed under the light-emitting element.

The imaged area CA may include light-transmitting areas AG disposed between pixel groups and a camera module 400 disposed under the imaged area CA. In an imaged mode, the camera module 400 may perform a photoelectric conversion on light incident through the imaged area CA using an image sensor and convert pixel data of an image, which is output from the image sensor, into digital data to output imaged image data.

The display panel driving unit may write the pixel data of the input image to the pixels P. The pixels P may be interpreted as a pixel group including a plurality of sub-pixels.

The display panel driving unit may include a data driving unit 306 configured to supply a data voltage of the pixel data to the data lines DL, and a gate driving unit 120 configured to sequentially supply a gate pulse to the gate lines GL. The data driving unit 306 may be integrated into a driver IC 300. The display panel driving unit may further include a touch sensor driving unit omitted from the drawing.

The driver IC 300 may be attached to the display panel 100. The driver IC 300 receives pixel data of an input image and a timing signal from a host system 200, supplies a data voltage of the pixel data to the pixels, and synchronizes the data driving unit 306 with the gate driving unit 120.

The driver IC 300 may be connected to the data lines DL through data output channels to supply the data voltage of the pixel data to the data lines DL. The driver IC 300 may output a gate timing signal for controlling the gate driving unit 120 through gate timing signal output channels.

The gate timing signal generated from a timing controller 303 may include a gate start pulse VST, a gate shift clock CLK, and the like. The gate start pulse VST and the gate shift clock CLK may swing between a gate-on voltage VGL and a gate-off voltage VGH.

The gate timing signal (VST and CLK) output from a level shifter 307 may be applied to the gate driving unit 120 to control a shift operation of the gate driving unit 120.

The gate driving unit 120 may include a shift register formed on the circuit layer of the display panel 100 together with the pixel array. The shift register of the gate driving unit 120 may sequentially supply a gate signal to the gate lines GL under the control of the timing controller. The gate signal may include a scan pulse and an EM pulse of an emission signal.

The shift register may include a scan driving unit configured to output the scan pulse, and an EM driving unit configured to output the EM pulse. In FIG. 15, "GVST" and "GCLK" are signals included in the gate timing signal that is input to the scan driving unit. "EVST" and "ECLK" are signals included in the gate timing signal that is input to the EM driving unit.

The driver IC 300 may be connected to the host system 200, a first memory 301, and the display panel 100. The driver IC 300 may include a data reception and computation unit 308, the timing controller 303, the data driving unit 306, a gamma compensation voltage generation unit 305, a power supply unit 304, a second memory 302, and the like.

The data reception and computation unit 308 may include a reception unit configured to receive pixel data input as a digital signal from the host system 200 and a data computation unit configured to process the pixel data input through the reception unit to improve image quality.

The data computation unit may include a data restoration unit configured to perform restoration by decoding compressed pixel data, an optical compensation unit configured to add a preset optical compensation value to the pixel data, and the like. The optical compensation value may be set as a value for compensating for luminance of each piece of pixel data based on the luminance of the screen that is measured on the basis of a camera image captured in a manufacturing process.

The timing controller 303 may provide the pixel data of the input image received from the host system 200 to the data driving unit 306. The timing controller 303 may generate a gate timing signal for controlling the gate driving unit 120 and a source timing signal for controlling the data driving unit 306 to control operation timing of the gate driving unit 120 and the data driving unit 306.

The data driving unit 306 may convert digital data including the pixel data received from the timing controller 303 into a gamma compensation voltage using a digital-to-analog converter (DAC) and output a data voltage. The data voltage output from the data driving unit 306 may be supplied to the data lines DL of the pixel array through an output buffer connected to a data channel of the driver IC 300.

The gamma compensation voltage generation unit 305 may generate a gamma compensation voltage for each grayscale by dividing a gamma reference voltage received from the power supply unit 304 through a voltage divider circuit. The gamma compensation voltage is an analog voltage in which a voltage is set for each grayscale of the pixel data. The gamma compensation voltage output from the gamma compensation voltage generation unit 305 may be provided to the data driving unit 306.

The power supply unit 304 may generate power necessary to drive the driver IC 300, the gate driving unit 120, and the pixel array of the display panel 100 using a DC-DC converter. The DC-DC converter may include a charge pump, a regulator, a buck converter, a boost converter, and the like.

The power supply unit 304 may generate DC voltages such as a gamma reference voltage, a gate-on voltage VGL, a gate-off voltage VGH, a pixel driving voltage VDD, a low-potential power supply voltage VSS, an initialization voltage Vini, and the like by adjusting a DC input voltage received from the host system 200.

The gamma reference voltage may be supplied to the gamma compensation voltage generation unit 305. The gate-on voltage VGL and the gate-off voltage VGH may be supplied to the level shifter 307 and the gate driving unit 120. Pixel power voltages such as the pixel driving voltage VDD, the low-potential power supply voltage VSS, and the initialization voltages Vini may be supplied in common to the pixels P.

The initialization voltage Vini may be set to a DC voltage that is lower than the pixel driving voltage VDD and is lower than a threshold voltage of the light-emitting element OLED to initialize main nodes of the pixel circuits and suppress light emission of the light-emitting element OLED.

When power is supplied to the driver IC 300, the second memory 302 may store a compensation value, register setting data, and the like that are received from the first memory 301.

The compensation value may be applied to various algorithms for improving image quality. The compensation value may include the optical compensation value. The register setting data may define operations of the data driving unit 306, the timing controller 303, the gamma compensation voltage generation unit 305, and the like. The first memory 301 may include a flash memory. The second memory 302 may include a static random-access memory (SRAM).

The host system 200 may be implemented as an application processor (AP). The host system 200 may transmit the pixel data of the input image to the driver IC 300 through a mobile industry processor interface (MIPI). The host system 200 may be connected to the driver IC 300 through a flexible printed circuit, for example, a flexible printed circuit (FPC).

The display panel 100 may be implemented as a flexible panel applicable to a flexible display. The flexible display may have a screen that is variable in size by rolling, folding, or bending the flexible panel and may be easily manufactured with various designs.

The flexible display may be implemented as a rollable display, a foldable display, a bendable display, a slidable display, or the like.

The flexible panel may be manufactured as a so-called a "plastic OLED panel." The plastic OLED panel may include a back plate and a pixel array formed on an organic thin film adhered to the back plate. A touch sensor array may be formed on the pixel array.

The back plate may be a polyethylene terephthalate (PET) substrate. The pixel array and the touch sensor array may be formed on the organic thin film. The back plate may block the permeation of moisture to the organic thin film so that the pixel array is not exposed to moisture.

The organic thin film may be a polyimide (PI) substrate. A multilayer buffer film may be formed of an insulating material (not shown) on the organic thin film. The circuit layer 12 and the light-emitting element layer 14 may be stacked on the organic thin film.

In the display device of the present disclosure, the pixel circuit and the gate driving unit disposed on the circuit layer 12 may include a plurality of transistors. The transistors may be implemented as oxide thin-film transistors (TFTs) including an oxide semiconductor, low-temperature polysilicon (LTPS) TFTs including LTPS, and the like. Each of the transistors may be implemented as a p-channel thin-film transistor (TFT) or an n-channel TFT. The following embodiments will be described focusing on an example in which the transistors of the pixel circuit are implemented as p-channel TFTs, but the present disclosure is not limited thereto.

The transistors are three-electrode elements including a gate, a source, and a drain. The source is an electrode that provides carriers to the transistor. The carriers in the transistor may start to flow from the source. The drain is an electrode through which the carriers are discharged from the transistor to the outside.

In the transistor, carriers flow from the source to the drain. In the case of an n-channel transistor, carriers are electrons, and thus a source voltage is lower than a drain voltage so that the electrons flow from the source to the drain. In the n-channel transistor, current flows from the drain to the source.

In the case of a p-channel transistor (PMOS), carriers are holes, and thus a source voltage is higher than a drain voltage so that the holes flow from the source to the drain. In the p-channel transistor, since the holes flow from the source to the drain, current flows from the source to the drain. It should be noted that the source and the drain of the transistor are not fixed in position. For example, the source and the drain are interchangeable depending on the applied voltage. Accordingly, the present disclosure is not limited by the source and the drain of the transistor. In the following description, the source and the drain of the transistor will be referred to as a first electrode and a second electrode.

A gate pulse may swing between a gate-on voltage and a gate-off voltage. The gate-on voltage may be set to be higher than a threshold voltage of the transistor, and the gate-off voltage may be set to be lower than the threshold voltage of the transistor.

The transistor may be turned on in response to the gate-on voltage and turned off in response to the gate-off voltage. In the case of an n-channel transistor, the gate-on voltage may be a gate-high voltage VGH, and the gate-off voltage may be a gate-low voltage VGL. In the case of a p-channel transistor, the gate-on voltage may be a gate-low voltage VGL, and the gate-off voltage may be a gate-high voltage VGH.

The driving element of the pixel circuit may be implemented as a transistor. The driving element should have uniform electrical characteristics between all the pixels, but there may be differences in electrical characteristics between the pixels due to a process variation and an element characteristic variation, and the electrical characteristics may vary as a display driving time passes.

In order to compensate for the electrical characteristic variation of the driving element, the display device may include an internal compensation circuit and an external compensation circuit. The internal compensation circuit may be added to the pixel circuit in each of the subpixels to sample a threshold voltage Vth and/or a mobility µ of the driving element, which vary according to the electrical characteristics of the driving element, and compensate for the variation in real time.

The external compensation circuit may transmit the threshold voltage and/or mobility of the driving element, which are sensed through the sensing line connected to each of the subpixels, to an external compensation unit. The compensation unit of the external compensation circuit may reflect the sensing result to modulate the pixel data of the input image, thereby compensating for the variation in the electrical characteristics of the driving element.

A voltage of the pixel, which varies according to electrical characteristics of an external compensation driving element, may be sensed, and data of an input image may be modulated in an external circuit based on the sensed voltage, thereby compensating for the variation in the electrical characteristics of the driving element between the pixels. FIG. 16 is a circuit diagram illustrating an example of the pixel circuit, and FIG. 17 is a circuit diagram illustrating another example of the pixel circuit. FIG. 18 is a diagram illustrating a method of driving the pixel circuits shown in FIGS. 16 and 17.

The pixel circuits shown in FIGS. 16 and 17 may be similarly applied to the pixel circuit of the display area DA and the imaged area CA. The pixel circuit applicable to the present disclosure may be implemented as the circuits shown in FIGS. 16 and 17, but the present disclosure is not limited thereto.

Referring to FIGS. 16 to 18, the pixel circuit may include a light-emitting element OLED, a driving element DT configured to supply current to the light-emitting element OLED, and an internal compensation circuit configured to sample a threshold voltage Vth of the driving element DT using a plurality of switch elements M1 to M6 and compensate for a gate voltage of the driving element DT by as much as the threshold voltage Vth of the driving element DT. Each of the driving element DT and the switch elements M1 to M6 may be implemented as a p-channel TFT.

A driving period of the pixel circuit using the internal compensation circuit may be divided into an initialization period Tini, a sampling period Tsam, a data writing period Twr, and a light emission period Tem, as shown in FIG. 18.

During the initialization period Tini, an N−1th scan signal SCAN(N−1) is generated as a pulse of a gate-on voltage VGL, and a voltage of each of an Nth scan signal SCAN(N) and an emission signal EM(N) is a gate-off voltage VGH. During the sampling period Tsam, the Nth scan signal SCAN(N) is generated as a pulse of the gate-on voltage VGL, and a voltage of each of the N−1th scan signal SCAN(N−1) and the emission signal EM(N) is the gate-off voltage VGH. During the data writing period Twr, a voltage of each of the N−1th scan signal SCAN(N−1), the Nth scan signal SCAN(N), and the emission signal EM(N) is the gate-off voltage VGH. During at least a partial period of the light emission period Tem, the emission signal EM(N) may be generated as the gate-on voltage VGL, and a voltage of each of the N−1th scan signal SCAN(N−1) and the Nth scan signal SCAN(N) may be generated as the gate-off voltage VGH.

During the initialization period Tini, a fifth switch element M5 may be turned on according to the gate-on voltage VGL of the N−1th scan signal SCAN(N−1) to initialize the pixel circuit. During the sampling period Tsam, first and second switch elements M1 and M2 may be turned on according to the gate-on voltage VGL of the Nth scan signal SCAN(N) so that the threshold voltage of the driving element DT may be sampled and stored in a storage capacitor Cst1. At the same time, a sixth switch element M6 may be turned on during the sampling period Tsam to lower a voltage of a fourth node n4 to a reference voltage Vref to suppress light emission of the light-emitting element OLED. During the data writing period Twr, the first to sixth switch elements M1 to M6 may be maintained in an OFF state. During the light emission period Tem, the third and fourth switch elements M3 and M4 may be turned on so that the light-emitting element OLED may emit light. In the light emission period Tem, in order to precisely express a luminance of a low grayscale with a duty ratio of the emission signal EM(N), the emission signal EM(N) may swing between the gate-on voltage VGL and the gate-off voltage VGH at a selected duty ratio to repeat turning the third and fourth switch elements M3 and M4 on or off. In some embodiments, the emission signal EM(N) may swing between the gate-on voltage VGL and the gate-off voltage VGH at a predetermined duty ratio to repeat turning the third and fourth switch elements M3 and M4 on or off.

The light-emitting element OLED may be implemented as an organic light-emitting diode or an inorganic light-emitting diode. Hereinafter, an example in which the light-emitting element OLED is implemented as an organic light-emitting diode will be described.

The light-emitting element OLED may include an organic compound layer formed between an anode and a cathode. The organic compound layer may include a hole injection layer HIL, a hole transport layer HTL, a light-emitting layer EML, an electron transport layer ETL, and an electron injection layer EIL, but the present disclosure is not limited thereto. When a voltage is applied to the anode and the cathode of the OLED, holes passing through the hole transport layer HTL and electrons passing through the electron transport layer ETL move to the emission layer EML to create excitons, and thus visible light may be emitted from the light-emitting layer EML.

The anode of the light-emitting element OLED is connected to the fourth node n4 between the fourth and sixth switch elements M4 and M6. The fourth node n4 is connected to the anode of the light-emitting element OLED, a second electrode of the fourth switch element M4, and a second electrode of the sixth switch element M6. The cathode of the light-emitting element OLED may be connected to the VSS line PL3 to which the low-potential power supply voltage VSS is applied. The light-emitting element OLED may emit light with a current Ids that flows according to a gate-source voltage Vgs of the driving element DT. The third and fourth switch elements M3 and M4 may switch current paths of the light-emitting element OLED.

The storage capacitor Cst1 may be connected between the VDD line PL1 and a first node n1. A data voltage Vdata, which is compensated for by as much as the threshold voltage Vth of the driving element DT, may be charged to the storage capacitor Cst1. Since the data voltage Vdata in each sub-pixel is compensated for by as much as the threshold voltage Vth of the driving element DT, a characteristic deviation of the driving element DT in each sub-pixel may be compensated for.

The first switch element M1 may be turned on in response to the gate-on voltage VGL of the Nth scan signal SCAN(N) to connect a second node n2 to a third node n3. The second node n2 may be connected to a gate electrode of the driving element DT, a first electrode of the storage capacitor Cst1, and a first electrode of the first switch element M1.

The third node n3 may be connected to a second electrode of the driving element DT, a second electrode of the first switch element M1, and a first electrode of the fourth switch element M4. A gate electrode of the first switch element M1 is connected to a first gate line GL1 to receive the Nth scan signal SCAN(N). The first electrode of the first switch element M1 may be connected to the second node n2, and the second electrode thereof may be connected to the third node n3.

In some embodiments, the first switch element M1 may be turned on only in a very short one horizontal period 1H during which the Nth scan signal SCAN(N) is generated as the gate-on voltage VGL in one frame period and thus may be maintained in an OFF state for about one frame period, and thus a leakage current may be generated in the OFF state of the first switch element M1. In order to suppress the leakage current of the first switch element M1, the first switch element M1 may be implemented as a dual-gate structure transistor having two transistors M1a and M1b connected in series, as shown in FIG. 18.

The second switch element M2 may be turned on in response to the gate-on voltage VGL of the Nth scan signal SCAN(N) to supply the data voltage Vdata to the first node n1. A gate electrode of the second switch element M2 may be connected to the first gate line GL1 to receive the Nth scan signal SCAN(N). A first electrode of the second switch element M2 may be connected to the first node n1. A second electrode of the second switch element M2 may be connected to a data line DL to which the data voltage Vdata is applied. The first node n1 may be connected to the first electrode of the second switch element M2, a second electrode of the third switch element M3, and a first electrode of the driving element DT.

The third switch element M3 may be turned on in response to the gate-on voltage VGL of the emission signal EM(N) to connect the VDD line PL1 to the first node n1. A gate electrode of the third switch element M3 may be connected to a third gate line GL3 to receive the emission signal EM(N). A first electrode of the third switch element M3 may be connected to the VDD line PL1. The second electrode of the third switch element M3 may be connected to the first node n1.

The fourth switch element M4 may be turned on in response to the gate-on voltage VGL of the emission signal EM(N) to connect the third node n3 to the anode of the light-emitting element OLED. A gate electrode of the fourth switch element M4 may be connected to the third gate line GL3 to receive the emission signal EM(N). The first electrode of the fourth switch element M4 may be connected to the third node n3, and the second electrode thereof may be connected to the fourth node n4.

The fifth switch element M5 may be turned on in response to the gate-on voltage VGL of the N−1th scan signal SCAN(N−1) to connect the second node n2 to the Vini line PL2. A gate electrode of the fifth switch element M5 may be connected to a second gate line GL2 to receive the N−1th scan pulse SCAN(N−1). A first electrode of the fifth switch element M5 may be connected to the second node n2, and a second electrode thereof may be connected to the Vini line PL2. In order to suppress a leakage current of the fifth switch element M5, the fifth switch element M5 may be implemented as a dual-gate structure transistor having two transistors M5a and M5b connected in series, as shown in FIG. 18.

The sixth switch element M6 may be turned on in response to the gate-on voltage VGL of the Nth scan signal SCAN(N) to connect the Vini line PL2 to the fourth node n4. A gate electrode of the sixth switch element M6 may be connected to the first gate line GL1 to receive the Nth scan signal SCAN(N). The first electrode of the sixth switch element M6 may be connected to the Vini line PL2, and the second electrode thereof may be connected to the fourth node n4.

The driving element DT may adjust the current Ids, which flows in the light-emitting element OLED according to the gate-source voltage Vgs, to drive the light-emitting element OLED. The driving element DT may include the gate electrode connected to the second node n2, the first electrode connected to the first node n1, and the second electrode connected to the third node n3.

As shown in FIG. 18, the N−1th scan signal SCAN(N−1) may be generated as the gate-on voltage VGL during the initialization period Tini. During the initialization period Tini, the Nth scan signal SCAN(N) and the emission signal EM(N) may each be maintained at the gate-off voltage VGH. Thus, during the initialization period Tini, the fifth switch element M5 may be turned on so that the second and fourth nodes n2 and n4 may each be initialized to "Vini." A hold period Th may be set between the initialization period Tini and the sampling period Tsam. During the hold period Th, the gate signals SCAN(N−1), SCAN(N), and EM(N) may be maintained in previous states thereof.

During the sampling period Tsam, the Nth scan signal SCAN(N) may be generated as the gate-on voltage VGL. The Nth scan signal SCAN(N) may be synchronized with the data voltage Vdata of an Nth pixel line. During the sampling period Tsam, the N−1th scan signal SCAN(N−1) and the emission signal EM(N) may each be maintained at the gate-off voltage VGH. Thus, during the sampling period Tsam, the first and second switch elements M1 and M2 may be turned on.

During the sampling period Tsam, a gate voltage DTG of the driving element DT may rise due to a current flowing through the first and second switch elements M1 and M2. When the driving element DT is turned off, the gate voltage DTG is Vdata-|Vth|. In this case, the voltage of the first node n1 is also Vdata-|Vth|. During the sampling period Tsam, the gate-source voltage Vgs of the driving element DT is |Vgs|=Vdata−(Vdata−|Vth|)=|Vth|. During the data writing period Twr, the Nth scan signal SCAN(N) may be inverted to the gate-off voltage VGH. During the data writing period Twr, the N−1th scan signal SCAN(N−1) and the emission signal EM(N) may each be maintained at the gate-off voltage VGH. Thus, during the data writing period Twr, all the switch elements M1 to M6 may be maintained in an OFF state.

During the light emission period Tem, the emission signal EM(N) may be generated as the gate-on voltage VGL. During the light emission period Tem, in order to improve a low grayscale representation, the emission signal EM(N) may be turned on or off at a selected duty ratio to swing between the gate-on voltage VGL and the gate-off voltage VGH. Accordingly, the emission signal EM(N) may be generated as the gate-on voltage VGL for at least a partial period of the light emission period Tem.

When the emission signal EM(N) is at the gate-on voltage VGL, a current flows between "VDD" and the light-emitting element OLED so that the light-emitting element OLED may emit light. During the light emission period Tem, the N−1th and Nth scan pulses SCAN(N−1) and SCAN(N) may each be maintained at the gate-off voltage VGH. During the light emission period Tem, the third and fourth switch elements M3 and M4 may be repeatedly turned on and off according to the voltage of the emission signal EM(N). When the emission signal EM(N) is at the gate-on voltage VGL, the third and fourth switch elements M3 and M4 are turned on so that current flows in the light-emitting element OLED. In this case, "Vgs" of the driving element DT satisfies |Vgs|=VDD−(Vdata-|Vth|), and the current flowing in the light-emitting element OLED is K(VDD-Vdata)2. "K" is a constant determined by charge mobility, parasitic capacitance, and a channel capacity of the driving element DT.

FIG. 19 is a cross-sectional view illustrating a cross-sectional structure of a pixel area in a display panel according to one embodiment of the present disclosure in detail, and FIG. 20 illustrates a cross-sectional structure of the pixel area and a light-transmitting area according to one embodiment of the present disclosure.

The cross-sectional structure of the display panel 100 is not limited to that in FIG. 19. In FIG. 19, "TFT" represents a driving element DT of the pixel circuit.

Referring to FIG. 19, a circuit layer, a light-emitting element layer, and the like may be stacked on substrates PI1 and PI2 in a pixel area PIX. The substrates PI1 and PI2 may include a first PI substrate PI1 and a second PI substrate PI2. An inorganic film IPD may be formed between the first PI substrate PI1 and the second PI substrate PI2. The inorganic film IPD may block the penetration of moisture.

A first buffer layer BUF1 may be formed on the second PI substrate PI2. A first metal layer may be formed on the first buffer layer BUF1, and a second buffer layer BUF2 may be formed on the first metal layer.

The first metal layer may be patterned by a photolithography process. The first metal layer may include a light shield pattern BSM. The light shield pattern BSM may block external light so that the light does not irradiate to an active layer of a TFT, thereby preventing a photo current of the TFT formed in the pixel area from generating.

When the light shield pattern BSM is formed of a metal having a low absorption coefficient of a laser wavelength used in a laser ablation process as compared to a metal layer (e.g., a cathode) to be removed from the imaged area CA, the light shield pattern BSM may also serve as a light shield layer LS configured to block a laser beam LB in the laser ablation process.

Each of the first and second buffer layers BUF1 and BUF2 may be made of an inorganic insulating material and may be formed of one or more insulating layers.

An active layer ACT may be made of a semiconductor material deposited on the second buffer layer BUF2 and may be patterned by a photolithography process. The active layer ACT may include an active pattern of each of TFTs of the pixel circuit and TFTs of the gate driving unit. A portion of the active layer ACT may be metallized by ion doping. The metallized portion may be used as a jumper pattern connecting the metal layers at some nodes of the pixel circuit to connect components of the pixel circuit.

A gate insulating layer GI may be formed on the second buffer layer BUF2 so as to cover the active layer ACT. The gate insulating layer GI may be made of an inorganic insulating material.

A second metal layer may be formed on the gate insulating layer GI. The second metal layer may be patterned by a photolithography process. The second metal layer may include a gate line, a gate electrode pattern GATE, a lower electrode of the storage capacitor Cst1, a jumper pattern connecting patterns of the first metal layer and a third metal layer, and the like.

A first interlayer insulating layer ILD1 may be formed on the gate insulating layer GI so as to cover the second metal layer. The third metal layer may be formed on the first interlayer insulating layer ILD1, and a second interlayer insulating layer ILD2 may cover the third metal layer. The third metal layer may be patterned by a photolithography process. The third metal layer may include metal patterns TM, such as an upper electrode of the storage capacitor Cst1. The first and second interlayer insulating layers ILD1 and ILD2 may each include an inorganic insulating material.

A fourth metal layer may be formed on the second interlayer insulating layer ILD2, and an inorganic insulating layer PAS1 and a first planarization layer PLN1 may be stacked on the fourth metal layer. A fifth metal layer may be formed on the first planarization layer PLN1.

Some patterns of the fourth metal layer may be connected to the third metal layer through a contact hole passing through the first planarization layer PLN1 and the inorganic insulating layer PAS1. The first and second planarization layers PLN1 and PLN2 may each be made of an organic insulating material enabling surfaces thereof to be flat.

The fourth metal layer may include first and second electrodes of a TFT connected to an active pattern of the TFT through a contact hole passing through the second interlayer insulating layer ILD2. The data line DL and the power lines PL1, PL2, and PL3 may be implemented using a pattern SD1 of the fourth metal layer or a pattern SD2 of the fifth metal layer.

An anode AND, which is a first electrode layer of the light-emitting element OLED, may be formed on the second planarization layer PLN2. The anode AND may be connected to an electrode of a TFT used as the switch element or the driving element through a contact hole passing through the second planarization layer PLN2. The anode AND may be made of a transparent or semitransparent electrode material.

A pixel-defining film BNK may cover the anode AND of the light-emitting element OLED. The pixel-defining film BNK may be formed in a pattern that defines an emission area (or an opening area) through which light passes to the outside from each of the pixels. A spacer SPC may be formed on the pixel-defining film BNK. The pixel-defining film BNK and the spacer SPC may be integrated with the same organic insulating material. The spacer SPC may secure a gap between a fine metal mask (FMM) and the anode AND so that the FMM is not in contact with the anode AND in a deposition process of an organic compound EL.

The organic compound EL may be formed in the emission area of each of the pixels, which is defined by the pixel-defining film BNK. In some embodiments, a cathode CAT, which is a second electrode layer of the light-emitting element OLED, may be formed on the entire surface of the display panel 100 so as to cover the pixel-defining film BNK, the spacer SPC, and the organic compound EL. The cathode CAT may be connected to the VSS line PL3 formed of any one of the metal layers therebelow. A capping layer CPL may cover the cathode CAT. The capping layer CPL may be made of an inorganic insulating material to block the penetration of the air and out-gassing of the organic insulating material, which is applied on the capping layer CPL, to protect the cathode CAT. An inorganic insulating layer PAS2 may cover the capping layer CPL, and the planarization layer PCL may be formed on the inorganic insulating layer PAS2. The planarization layer PCL may include an organic insulating material. An inorganic insulating layer PAS3 of the encapsulation layer may be formed on the planarization layer PCL.

The polarizing plate 18 may be disposed on the inorganic insulating layer PAS3 to improve the outdoor visibility of the display device. The polarizing plate 18 may reduce the reflection of light from a surface of the display panel 100 and block the light reflected from metal of the circuit layer 12, thereby improving the brightness of the pixels.

Referring to FIG. 20, in the light-transmitting area AG, the first light-transmitting pattern 18*d* may be formed in the polarizing plate 18. The first light-transmitting pattern 18*d* may be formed by discoloring the polarizer 18*b* using a laser, or the first light-transmitting pattern 18*d* may be formed by partially removing the polarizer 18*b*.

In the light-transmitting area AG, an opening H1 may be formed in the cathode CAT. The opening H1 may be formed by forming the cathode CAT on the pixel-defining film BNK and then etching the cathode CAT and the pixel-defining film BNK at once. Accordingly, a first groove RC1 may be formed in the pixel-defining film BNK, and the opening H1 of the cathode CAT may be formed on the first groove RC1. However, the present disclosure is not necessarily limited thereto, and the cathode CAT may be disposed on the second planarization layer PLN2 without forming the pixel-defining film on the light-transmitting area AG.

According to the embodiment, in the light-transmitting area AG, the first light-transmitting pattern 18*d* is formed in the polarizing plate 18, and the opening H1 is formed in the cathode so that light transmittance may be improved. Thus, a sufficient amount of light may be introduced into the camera module 400 so that camera performance may be improved. In addition, noise of imaged image data may be reduced.

FIG. 21 illustrates a first modified example of FIG. 20, FIG. 22 illustrates a second modified example of FIG. 20, and FIG. 23 illustrates a third modified example of FIG. 20.

Referring to FIG. 21, a second groove RC2 passing through a buffer layer of the circuit layer and the plurality of insulating layers may be formed in the light-transmitting area AG. In addition, the first planarization layer PLN1 may include a protrusion inserted into the second groove RC2. With this configuration, interfaces of the plurality of layers may be omitted so that light transmittance of the light-transmitting area AG may be improved.

Referring to FIG. 22, a third groove RC3 may be formed in a first surface (upper surface) of the substrates PI1 and PI2, on which the plurality of insulating layers are formed, and the third groove RC3 may be connected to the second groove RC2. That is, in a process of forming the second groove RC2 after the inorganic insulating films ILD2 and PAS1 are formed, a groove may be formed to the second PI substrate PI2. In addition, the groove may also be formed up to a partial area of the second PI substrate PI2 through the inorganic film IPD as needed.

Referring to FIG. 23, a fourth groove RC4 overlapping the third groove RC3 may also be formed in a second surface (lower surface) of the substrates PI1 and PI2, which is opposite to the first surface (upper surface). This configuration may be formed by removing a growth substrate and then etching a portion of the second PI substrate PI2. The fourth groove RC4 may be filled with a transparent material TM1 so that strength may be reinforced. The transparent material TM1 may be selected from various materials that transmit visible light. For example, the transparent material TM1 may include a resin.

According to the embodiments, light transmittance can be increased in an imaged area. Accordingly, noise of captured image data can be reduced so that camera performance can be improved.

Effects of the present disclosure will not be limited to the above-mentioned effects and other unmentioned effects will be clearly understood by those skilled in the art from the following claims.

While the embodiments of the present disclosure have been described in detail above with reference to the accompanying drawings, the present disclosure is not necessarily limited to these embodiments, and various changes and modifications may be made without departing from the technical spirit of the present disclosure. Accordingly, the embodiments disclosed herein are to be considered descriptive and not restrictive of the technical spirit of the present disclosure, and the scope of the technical spirit of the present disclosure is not limited by these embodiments. Therefore, the above-described embodiments should be understood to be examples and not limiting in any aspect. All technical spirits within the scopes of their equivalents should be construed as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel comprising:
   a first area in which a plurality of first pixels is disposed;
   a second area including a pixel area in which a plurality of second pixels is disposed and a plurality of light-transmitting areas disposed between the plurality of second pixels;

a polarizing plate including a plurality of first light-transmitting patterns disposed on the plurality of light-transmitting areas; and a light-emitting element layer disposed under the polarizing plate, wherein the light-emitting layer includes at least one light-emitting element emitting light toward the polarizing plate, wherein, in the polarizing plate, an area in which the first light-transmitting pattern of the plurality of first light-transmitting pattern is formed has a higher light transmittance than a remaining area in which the first light-transmitting pattern is not formed, and wherein the at least one light-emitting element does not overlap with the plurality of first light-transmitting patterns from a plan view.

2. The display panel of claim 1, wherein density of the plurality of second pixels disposed in the second area is lower than a density of the plurality of first pixels disposed in the first area.

3. The display panel of claim 1, wherein the second area is disposed at a position overlapping a camera module.

4. The display panel of claim 1, wherein
the polarizing plate includes a first protective layer, a second protective layer, and a polarizer disposed between the first protective layer and the second protective layer, and
the plurality of first light-transmitting patterns is formed in the polarizer.

5. The display panel of claim 4, wherein each of the plurality of first light-transmitting patterns includes a plurality of openings formed in the polarizer.

6. The display panel of claim 5, wherein the first protective layer includes a protrusion inserted into the plurality of openings.

7. The display panel of claim 4, wherein each of the plurality of light-transmitting areas includes a discolored area formed in the polarizer.

8. The display panel of claim 7, wherein the discolored area is an area in which an iodine compound of the polarizer is decomposed.

9. The display panel of claim 1, wherein
the pixel area includes a circuit layer disposed on a substrate, a first electrode layer disposed on the circuit layer, a light-emitting element layer disposed on the first electrode layer, and a second electrode layer disposed on the light-emitting element layer, and
the second electrode layer includes an opening formed in each of the light-transmitting areas.

10. The display panel of claim 9, wherein
the pixel area includes a pixel-defining film that is disposed on the circuit layer and covers a portion of the first electrode layer,
the pixel-defining film includes a first groove formed in the light-transmitting area, and
the opening of the second electrode layer is disposed on the first groove.

11. The display panel of claim 9, wherein
the circuit layer includes a plurality of insulating layers, and
the circuit layer includes a second groove formed to extending through the plurality of insulating layers in the light-transmitting area.

12. The display panel of claim 11, wherein
the substrate includes a first surface on which the circuit layer is disposed and a second surface opposite to the first surface, and
the substrate includes a third groove formed in the first surface and connected to the second groove.

13. The display panel of claim 12, wherein the substrate includes a fourth groove that is formed in the second surface and overlaps the third groove.

14. The display panel of claim 9, wherein each of the first light-transmitting patterns overlaps the opening of the second electrode layer in the light-transmitting area.

15. A display device comprising:
a display panel including:
a first area in which a plurality of first pixels is disposed;
a second area including a pixel area, in which a plurality of second pixels is disposed, and a plurality of light-transmitting areas disposed between the plurality of second pixels;
a polarizing plate including a plurality of first light-transmitting patterns disposed in the plurality of light-transmitting areas; and
a light-emitting element layer disposed under the polarizing plate, the light-emitting layer including at least one light-emitting element emitting light toward the polarizing plate; and
at least one sensor disposed under the second area,
wherein, in the polarizing plate, an area in which the plurality of first light-transmitting patterns is formed has a higher light transmittance than a remaining area in which the plurality of first light-transmitting patterns is not formed, and
wherein the at least one light-emitting element does not overlap with the plurality of first light-transmitting patterns from a plan view.

16. The display device of claim 15, wherein the at least one sensor includes a camera module.

17. The display device of claim 15, wherein a density of the pixels disposed in the second area is lower than a density of the pixels disposed in the first area.

18. The display device of claim 15, wherein
the polarizing plate includes a first protective layer, a second protective layer, and a polarizer disposed between the first protective layer and the second protective layer, and
the plurality of first light-transmitting patterns is formed in the polarizer.

19. The display device of claim 18, wherein each of the plurality of first light-transmitting patterns includes a plurality of openings formed in the polarizer.

20. The display device of claim 18, wherein
each of the plurality of light-transmitting areas includes a discolored area formed in the polarizer, and
the discolored area is an area in which an iodine compound of the polarizer is decomposed.

* * * * *

UNITED STATES PATENT AND TRADEMARK OFFICE
CERTIFICATE OF CORRECTION

Page 1 of 1

PATENT NO. : 12,150,340 B2
APPLICATION NO. : 17/358791
DATED : November 19, 2024
INVENTOR(S) : Jung Hun Choi et al.

It is certified that error appears in the above-identified patent and that said Letters Patent is hereby corrected as shown below:

In the Claims

Column 23, Claim 1, Line 9:
"which the first" should read: --which a first--.

Column 23, Claim 1, Line 11:
"pattern is" should read: --patterns is--.

Column 23, Claim 2, Line 17:
"wherein density" should read: --wherein a density--.

Signed and Sealed this
Eighteenth Day of February, 2025

Coke Morgan Stewart
*Acting Director of the United States Patent and Trademark Office*